United States Patent [19]

Shimomura et al.

[11] Patent Number: 5,736,421
[45] Date of Patent: Apr. 7, 1998

[54] SEMICONDUCTOR DEVICE AND ASSOCIATED FABRICATION METHOD

[75] Inventors: Hiroshi Shimomura, Osaka; Kiyoyuki Morita, Kyoto; Takashi Nakabayashi, Osaka; Takashi Uehara, Osaka; Mitsuo Yasuhira, Osaka; Mizuki Segawa, Osaka; Takehiro Hirai, Osaka, all of Japan

[73] Assignee: Matsushita Electric Industrial Co., Ltd., Osaka, Japan

[21] Appl. No.: 589,897

[22] Filed: Jan. 23, 1996

Related U.S. Application Data

[62] Division of Ser. No. 348,205, Nov. 28, 1994, abandoned.

[30] Foreign Application Priority Data

Nov. 29, 1993 [JP] Japan .................. 5-298050
Dec. 28, 1993 [JP] Japan .................. 5-337725
Jul. 28, 1994 [JP] Japan .................. 6-176652

[51] Int. Cl.$^6$ .................................... H01L 21/70
[52] U.S. Cl. ...................... 437/52; 437/60; 437/919
[58] Field of Search ........................ 437/47, 48, 52, 437/60, 200, 919

[56] References Cited

U.S. PATENT DOCUMENTS 5,356,826 10/1994 Natsume ..................... 437/60
5,500,387 3/1996 Tung et al. .................. 437/60

*Primary Examiner*—John Niebling
*Assistant Examiner*—Joni Y. Chang
*Attorney, Agent, or Firm*—McDermott, Will & Emery

[57] ABSTRACT

Mounted on a single semiconductor substrate are a DRAM, MOS transistor, resistor, and capacitor. The gate electrode of the DRAM and the gate electrode of the MOS transistor are formed by a common layer (i.e., a first-level poly-Si layer). The storage electrode of the DRAM, the resistor, and the lower electrode of the capacitor are formed by a common layer (i.e., a third-level poly-Si layer). The plate electrode of the DRAM and the upper electrode of the capacitor are formed by a common layer (i.e., a fourth-level poly-Si layer).

6 Claims, 17 Drawing Sheets

F I G. 11
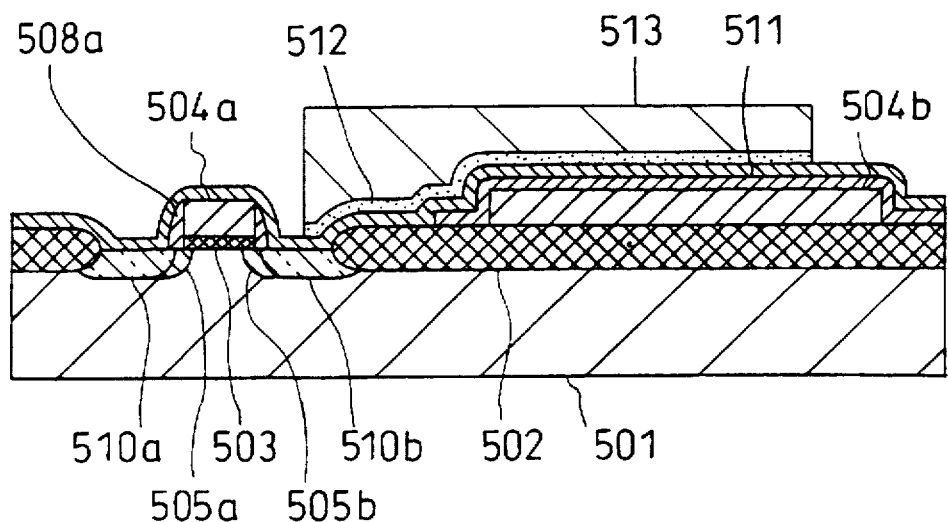
F I G. 12
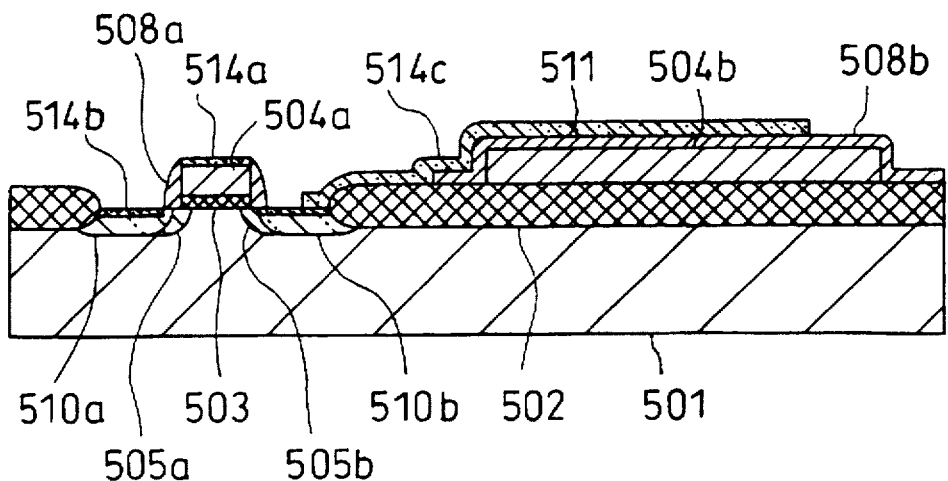

SEMICONDUCTOR DEVICE AND ASSOCIATED FABRICATION METHOD

This is a divisional of application Ser. No. 08/348,205, filed Nov. 28, 1994, abandoned.

BACKGROUND OF THE INVENTION

This invention in general relates to a semiconductor device, and to its associated semiconductor fabrication method. More specifically, this invention pertains to a system-on-chip technique allowing for a single chip to contain therein all the functions of an entire system (e.g., multimedia apparatus and the like apparatus).

Conventionally, a multimedia system has been implemented by a combination of technologies including semiconductor, computer, video, and telecommunication technologies. Such a system is formed by plural circuits with different functions. For example, as shown in FIG. 25, one system of this type is made up of a DRAM, microprocessor unit, I/O circuit, A/D converter, D/A converter, SCF (switched capacitor filter), MASK-ROM, f-EEPROM, high-voltage circuit, and the like. These circuits are fabricated by their respective processes; for example, a digital circuit (CMOS bipolar transistor), an analog circuit, and a memory are fabricated by different processes, and one circuit requires one chip.

The semiconductor memory industry is now trying to decrease the size of the semiconductor devices so as to provide compact, high-performance, low-power multimedia apparatus. Therefore, the system-on-chip technique is considered a key to realize such an improved multimedia apparatus, since the system-on-chip technique provides a way of mounting various circuits in a single chip. However, if a new LSI fabrication process has to be developed, this produces some problems. For example, the number of development steps increases and a higher production cost is required.

Additionally, there are certain types of circuits that have difficulties in being miniaturized. FIG. 26 schematically shows how the analog circuit area-to-digital circuit area ratio has changed with the design rules (from the 0.8-µm generation to the 0.5-µm generation to the 0.35-µm generation). In comparison with the digital circuit, the analog circuit finds it more difficult to follow the latest trends in miniaturization. Therefore, as seen from FIG. 26, as the LSI generation advances, a larger proportion of the chip area is occupied by the analog circuit. Reasons why the analog circuit has failed to keep up with the latest miniaturization trends are as follows:

(1) Analog circuit MOS transistor's poor linearity. It is preferable to use many field effect transistors rather than many bipolar transistors, to improve the level of integration. The MOS transistor's linearity is expressed by the parameter $\lambda$. In order to maintain adequate linearity, an analog circuit employs a transistor having a gate length longer than a minimum gate to prevent the parameter $\lambda$ from exceeding a predetermined value. If the gate length becomes shorter and shorter as the transistor miniaturization advances, this increases drain saturation current. As a result, the mutual conductance increases. Additionally, the drain depletion layer influences channels, thereby increasing the drain voltage. As a result, the drain saturation current increases, leading to poor linearity.

(2) Capacitance element's poor capacitance characteristics. When trying to maintain an adequate capacitance, the capacitance insulating layer must be made thinner and thinner. For example, when using a DRAM capacitance as an analog circuit capacitance, if a capacitance insulating layer is made thinner, a slight change in the film thickness, and roughness of the surface show up as a change in capacitance. This results in poor precision (absolute precision, compare precision) and increases dependence of the capacitance upon the applied voltage. Such a technique is not available for the analog circuit (e.g., a switched capacitor filter).

SUMMARY OF THE INVENTION

Bearing in mind the above-described disadvantages with the prior art techniques, the present invention was made. It is an object of the present invention to provide a miniaturized, high-performance, low-power semiconductor device by mounting plural circuits with different functions on a single semiconductor substrate.

The present invention provides a first semiconductor device. The first semiconductor device comprises (a) a first conductive layer which is formed on a semiconductor substrate and which forms either a bit line, a gate electrode, a plate electrode, or a storage electrode, of a DRAM and (b) a second conductive layer which is formed on the semiconductor substrate and which forms either a gate electrode of a MOS transistor, an emitter electrode of a bipolar transistor, a gate electrode of a PROM, an upper electrode or a lower electrode of a capacitor arranged in a circuit other than a peripheral circuit of a DRAM, a resistor, or an inductor, wherein the first and the second conductive layer are fabricated by the same fabrication step.

Since the first and the second conductive layer are concurrently formed, this simplifies the fabrication process of the semiconductor devices having DRAMs.

If in the first semiconductor device the second conductive layer serves as a lower electrode of a capacitor which is arranged in a circuit other than a peripheral circuit of a DRAM, it is preferable that the first semiconductor device further includes an upper electrode of the capacitor which is formed on the semiconductor substrate and which is arranged in a circuit other than a peripheral circuit of a DRAM, and both the lower electrode and the upper electrode are formed by a common conductive layer. This reduces the number of interconnections with respect to the lower and upper electrodes, therefore providing a smaller semiconductor device.

If in the first semiconductor device the second conductive layer serves as a lower or an upper electrode of a capacitor which is arranged in a circuit other than a peripheral circuit of a DRAM, it is preferable that the lower electrode is made up of a first and a second lower electrode, the first and the second lower electrode being spaced from each other, that the upper electrode is made up of a first and a second upper electrode, the first and the second upper electrode being spaced from each other, and that the first lower electrode and the second upper electrode are electrically connected together, and the second lower electrode and the first upper electrode are electrically connected together.

Such connection arrangement cancels dependence of the capacitance upon the applied voltage.

The present invention provides a second semiconductor device comprising (a) a first gate insulating layer of a transistor which forms an input/output interface circuit of an LSI having a different power supply system, the first gate insulating layer being formed on a semiconductor substrate, (b) a second gate insulating layer of a transistor which forms a peripheral circuit of a DRAM, the second gate insulating layer being formed on the semiconductor substrate and having a greater film thickness in comparison with a gate insulating layer of the DRAM, wherein the first and the second gate insulating layer are fabricated by the same fabrication step.

A transistor forming an input/output interface circuit of an LSI having a different power supply system and a transistor forming a DRAM peripheral circuit are required to have a gate insulating layer thicker than other gate insulating layers. In accordance with the present invention, the first and the second gate insulating layer to be formed thick are fabricated by the same fabrication step, thereby simplifying the fabrication process.

The present invention provides a first method for fabricating a semiconductor device including a DRAM having n conductive layers forming a bit line, a gate electrode, a plate electrode, and a storage electrode where the number n is an integer greater than or equal to three, and a capacitor having a lower electrode, a capacitance insulating layer, and an upper electrode. This semiconductor device fabrication method comprises (a) a first fabrication step of forming an (n−1)st lowermost conductive layer of the n conductive layers while at the same time forming the lower electrode of the capacitor, (b) a second fabrication step of forming an insulating layer on the (n−1)st conductive layer while at the same time forming the capacitance insulating layer on the lower electrode of the capacitor, and (c) a third fabrication step of forming an nth lowermost conductive layer of the n conductive layers on the insulating layer while at the same time forming the upper electrode of the capacitor on the capacitance insulating layer.

The capacitor lower electrode and the second uppermost conductive layer are concurrently formed, and the capacitor upper electrode and the DRAM uppermost conductive layer are concurrently formed. This reduces the number of heat treatments performed to the capacitor lower and upper electrodes, thereby reducing the variation in capacitance.

The present invention provides a second method for fabricating a semiconductor device including either a resistor or an inductor and a DRAM made up of n conductive layers forming a bit line, a gate electrode, a plate electrode, and a storage electrode, where the number n is an integer greater than or equal to three. This second semiconductor device fabrication method comprises (a) a fabrication step of forming either the resistor or the inductor while at the same time forming either an (n−1)st lowermost conductive layer of the n conductive layers or an nth lowermost conductive layer of the n conductive layers.

The resistor or inductor and the uppermost or second uppermost conductive layer are concurrently formed. This reduced the number of heat treatments, thereby reducing the variation in resistance of the resistor or the variation in inductance of the inductor.

The present invention provides a third semiconductor device comprising (a) a transistor which is formed on a semiconductor substrate and which has a gate electrode, (b) a sidewall insulating layer which is formed on a sidewall of the gate electrode, (c) a capacitor which is formed on the semiconductor substrate and which has a lower electrode, a capacitance insulating layer, and an upper electrode, wherein the sidewall insulating layer and the capacitance insulating layer are fabricated by the same fabrication step.

Since the capacitance insulating layer and the sidewall insulating layer are concurrently formed, this eliminates the need for carrying out a special fabrication step to form a capacitance insulating layer. Not only the film thickness of an insulating layer used to form a sidewall insulating layer but that of the capacitance insulating layer is from $1/7$ to $1/10$ of the film thickness of the conventional interlayer dielectric films. Therefore, a parallel-plate capacitor according to the third semiconductor device has a capacitance from seven to ten times that of one employing a conventional interlayer dielectric film. As a result, this invention can provide parallel-plate capacitors with a greater capacitance in comparison with conventional parallel-plate capacitors without performing a special fabrication step.

The present invention provides a fourth semiconductor device comprising (a) a transistor which is formed on a semiconductor substrate and which has a gate electrode, (b) a sidewall insulating layer which is formed on a sidewall of the gate electrode, (c) a conductive layer which is formed on the semiconductor substrate, (d) an insulating layer which is formed locally on the conductive layer, wherein a surface zone of the conductive layer located underneath the insulating layer has a greater resistance in comparison with a surface zone of the conductive layer not covered with the insulating layer, and the gate electrode and the conductive layer are fabricated by the same fabrication step, and the sidewall insulating layer and the insulating layer are fabricated by the same fabrication step.

The conductive layer and the gate electrode are concurrently formed by the same fabrication step, and the insulating layer to be formed on the conductive layer and the sidewall insulating layer are concurrently formed by the same fabrication step. This eliminates the need for carrying out a special fabrication step to form a conductive layer and also eliminates the need for performing a fabrication step to form an insulating layer. Further, an insulating layer is formed locally on the gate electrode, so that a silicide layer is not formed on a surface region of the conductive layer covered with the insulating layer. As a result, such a surface region of the conductive layer covered with the insulating layer has a resistance, say, about ten times that of a surface region of the conducting layer on which a silicide layer is formed because it is not covered with the insulating layer. Therefore, resistors with a greater capacitance as compared with conventional resistors can be formed without performing a special fabrication step.

The present invention provides a fifth semiconductor device comprising (a) a transistor which is formed on a periphery of a semiconductor substrate, (b) a silicidation prevention layer which is formed on the transistor, and (c) a capacitor which is formed on the semiconductor substrate and which has a lower electrode, a capacitance insulating layer, and an upper electrode, wherein the silicidation prevention layer and the capacitance insulating layer are fabricated by the same fabrication step.

The capacitance insulating layer and the silicidation prevention layer are concurrently formed by the same fabrication step, thereby eliminating the need for performing a special fabrication step to form a capacitance insulating layer. Therefore, like the third semiconductor device, parallel-plate capacitors with a greater capacitance in comparison with conventional parallel-plate capacitors can be formed without performing a special fabrication step.

The present invention provides a sixth semiconductor device comprising, (a) a transistor which is formed on a periphery of a semiconductor substrate, (b) a silicidation prevention layer which is formed on the transistor, (c) a conductive layer which is formed on the semiconductor substrate, and (d) an insulating layer which is formed locally on the conductive layer, wherein a surface zone of the conductive layer located underneath the insulating layer has a greater resistance in comparison with a surface zone of the conductive layer not covered with the insulating layer, and the silicidation prevention layer and the insulating layer are fabricated by the same fabrication step.

The insulating layer on the conductive layer and the silicide prevention layer are concurrently formed by the same fabrication step, thereby eliminating the need for carrying out a special fabrication step to form an insulating layer on the conductive layer. As a result, like the fourth semiconductor device, resistors with a greater capacitance as compared with conventional resistors can be formed without performing a special fabrication step.

It is preferable that the upper electrode of the capacitor in the third or fifth semiconductor device is formed by Ti silicide or TiN. This ensures the formation of the upper electrode.

The present invention provides a third method of fabricating a semiconductor device comprising (a) a first fabrication step of forming a transistor having a gate electrode on a semiconductor substrate while at the same time forming a capacitor lower electrode on the semiconductor substrate, (b) a second fabrication step of depositing an insulating layer on the gate electrode and on the lower electrode, (c) a third fabrication step of forming a resist pattern on the insulating layer in such a way as to mask the lower electrode, (d) a fourth fabrication step of anisotropically etching the insulating layer using the resist pattern as a mask to form a sidewall insulating layer on a sidewall of the gate electrode while at the same time forming a capacitance insulating layer of the capacitor on the lower electrode, and (e) a fifth fabrication step of forming an upper electrode of the capacitor on the capacitance insulating layer.

In the third semiconductor device fabrication method, the insulating layer is anisotropically etched using the formed resist pattern as a mask, whereupon the sidewall insulating layer is formed on the sidewall of the gate electrode and the capacitance insulating layer is formed on the lower electrode. This eliminates the need for performing a special fabrication step to form an insulating layer.

The present invention provides a fourth method of fabricating a semiconductor device comprising (a) a first fabrication step of simultaneously forming on a semiconductor substrate a transistor gate electrode and a conductive layer, (b) a second fabrication step of depositing an insulating layer on the gate electrode and on the conductive layer, (c) a third fabrication step of forming a resist patten on a surface of the insulating layer corresponding to a part of the conductive layer, and (d) a fourth fabrication step of anisotropically etching the insulating layer using the resist pattern as a mask to form a sidewall insulating layer on a sidewall of the gate electrode while at the same time forming an insulating layer on the part of the conductive layer, in order that a surface zone of the conductive layer located underneath the insulating layer has a greater resistance in comparison with a surface zone of the conductive layer not covered with the insulating layer.

In the fourth semiconductor device fabrication method, the insulating layer is anisotropically etched using the locally formed resist pattern as a mask, whereupon the sidewall insulating layer is formed on the sidewall of the gate electrode and the insulating layer is locally formed on the conductive layer. This eliminates the need for performing a special fabrication step to form an insulating layer.

The present invention provides a fifth method of fabricating a semiconductor device comprising (a) a first fabrication step of forming a transistor on a periphery of a semiconductor substrate while at the same time forming a lower electrode of a capacitor on the semiconductor substrate, (b) a second fabrication step of depositing an insulating layer on the transistor and on the lower electrode, (c) a third fabrication step of forming a resist pattern on the insulating layer in such a way as to mask the transistor and the lower electrode, (d) a fourth fabrication step of etching the insulating layer using the resist pattern as a mask to form a silicidation prevention layer on the transistor while at the same time forming a capacitance insulating layer of the capacitor on the lower electrode, and (e) a fifth fabrication step of forming an upper electrode of the capacitor on the capacitance insulating layer.

In the fifth semiconductor device fabrication method, the insulating layer is etched using the resist pattern formed over the transistor and lower electrode, to form the silicide prevention layer and the capacitance insulating layer at the same time. This eliminates the need for performing a special fabrication step to form a capacitance insulating layer.

The present invention provides a sixth method of fabricating a semiconductor device comprising (a) a first fabrication step of forming a transistor on a periphery of a semiconductor substrate while at the same time forming a conductive layer on the semiconductor substrate, (b) a second fabrication step of depositing an insulating layer on the transistor and on the conductive layer, (c) a third fabrication step of forming a resist patten on the insulating layer in such a way as to mask the transistor and a part of the conductive layer, and (c) a fourth fabrication step of etching the insulating layer using the resist pattern as a mask to form a silicidation prevention layer on the transistor while at the same time forming an insulating layer on the part of the conductive layer, in order that a surface zone of the conductive layer located underneath the insulating layer has a greater resistance in comparison with a surface zone of the conductive layer not covered with the insulating layer.

In the sixth semiconductor device fabrication method, the insulating layer is etched using the locally formed resist pattern, to simultaneously form the silicide prevention layer, and the insulating layer on a part of the conductive layer. This eliminates the need for performing a special fabrication step to form an insulating layer on a part of the conductive layer.

In the third or fifth semiconductor device fabrication method, the fifth fabrication step may comprise (a) depositing a Ti thin film on the semiconductor substrate, (b) locally forming an amorphous Si thin film on the insulating layer over the Ti thin film, and (c) performing a siliciding heat treatment to silicide the Ti thin film, to form an upper electrode of Ti silicide. The Ti thin film reacts with the amorphous silicon thin film to form an upper electrode of Ti silicide.

Further, in the third or fifth semiconductor device fabrication method, the fifth fabrication step may comprise (a) depositing a Ti thin film on the semiconductor substrate, and (b) performing a siliciding heat treatment with respect to the Ti thin film in an atmosphere of $N_2$, and nitriding a part of the Ti thin film not silicided, to form an upper electrode made of a TiN thin film.

BRIEF DESCRIPTION OF THE DRAWINGS

FIGS. 9–12 show in cross section steps of the fabrication of a semiconductor device in accordance with a fifth embodiment of the present invention.

DETAILED DESCRIPTION OF THE INVENTION

Figure 1:
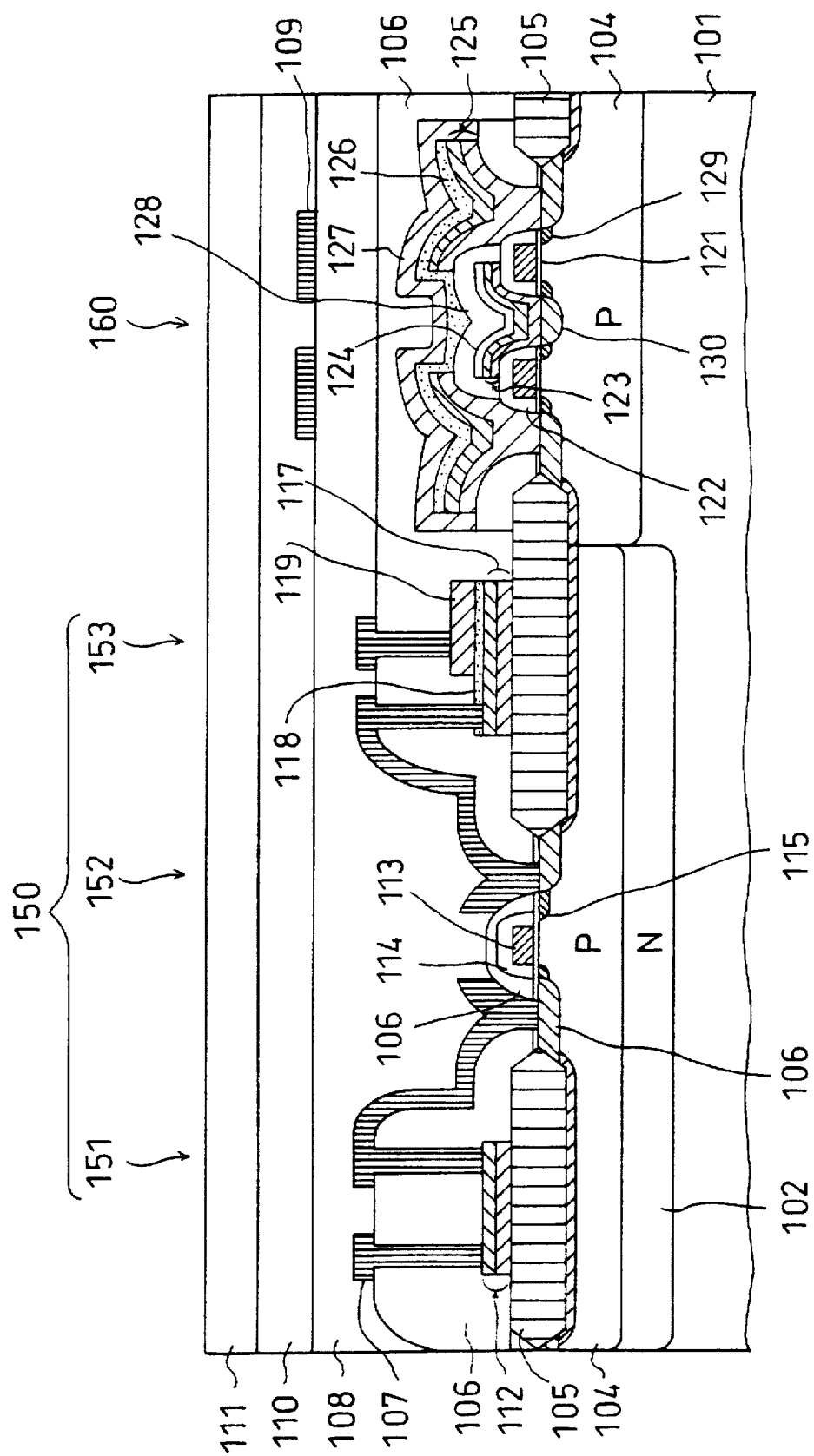
FIG. 1 shows in cross section a semiconductor device in accordance with a first embodiment of the present invention.

Preferred embodiments of the present invention will now be described below with reference to the drawing figures.

EXAMPLE 1

FIG. 1 shows in cross section a first semiconductor device of the present invention. The first semiconductor device has the following: a silicon substrate 101; a deep, n-type well 102; a p-type well 104; and a field oxide layer 105. Formed around a surface zone of the silicon substrate 101 are an analog circuit 150 and a DRAM cell 160 (i.e., a digital circuit). The analog circuit 150 has a resistance element 151, an NMOS transistor 152, and a capacitance element 153. Formed on the analog circuit 150 and the DRAM cell 160 are the following layers: a first interlayer dielectric film 106; a first wiring layer 107; a second interlayer dielectric film 108; a second wiring layer 109; a third interlayer dielectric film 110; and a third wiring layer 111. The analog circuit 150 is formed within the p-type well 104 of the p-type well 102. This guards the analog circuit 150 against noise generated by the DRAM cell 160.

The resistance element 151 has a resistance body 112 formed on top of the field oxide layer 105. This resistance body 112 is composed of a third-level polysilicon (poly-Si) layer and an amorphous silicon (a-Si) layer. The resistance body 112 has two points of contact with the first wiring layer 107 that reaches these contact points by passing through the first interlayer dielectric film 106. In other words, the resistance element 151 is formed by making use of electric resistance by the a-Si layer and the third-level poly-Si layer lying between the two contact points.

The NMOS transistor 152 has the following: a gate electrode 113 made up of a first-level poly-Si layer; a silicon oxide layer 114 that serves as a sidewall insulating layer and as an upper-surface protective layer with respect to the gate electrode 113; a source/drain region 115 which is lightly doped with an n-type impurity and which is located on one side of the gate electrode 113 beneath the first interlayer dielectric layer 106; and a source/drain region 116 which is lightly doped with an n-type impurity and which is located on the other side of the gate electrode 113 (see FIG. 1). The first wiring layer 107 passes through the first interlayer dielectric film 106 to make contact with the source/drain region 116. The flow of source-to-drain current through an N channel is controlled by bias applied to the gate electrode 113. The gate electrode 113 is formed by making use of conductivity characteristics of the first-level poly-Si layer. The source/drain region 116 is formed in such a way that the region 116 is kept away from a sidewall insulating layer formed on the sidewalls of the gate electrode 113 (i.e., an LDD structure). Such an LDD structure can control the drop in gm (i.e., the mutual conductance) and provide a transistor structure in which the drain depletion layer affects no channels.

The capacitance element 153 has the following: a capacitance lower-electrode 117 made up of the third-level poly-Si layer and its overlying a-Si layer; a capacitance insulating layer 118 made up of an oxidized $Si_3N_4$ layer deposited on the capacitance lower-electrode 117; and a capacitance upper-electrode 119 formed on the capacitance insulating layer 118. The capacitance element 153 is formed by making use of conductivity characteristics of the capacitance insulating layer 118 located between the capacitance lower-electrode 117 and the capacitance upper-electrode 119. The capacitance lower-electrode 117 is formed by making use of dielectric characteristics of the a-Si and third-level poly-Si layers.

The DRAM cell 160 has the following: two gate electrodes 121, 121 forming word lines; a silicon oxide layer 122 that covers the sidewalls and top surface of each gate electrode 121, 121; a bit line 123 with a polycide structure made up of a second-level poly-Si layer and its overlying WSi layer; a protective layer 124 formed on the bit line 123; a storage node 125 made up of a third-level poly-Si layer and an a-Si layer; a capacitance insulating layer 126 made up of an oxidized $Si_3N_4$ layer formed on the storage node 125; a plate electrode 127 made up of a fourth-level poly-Si layer formed on the capacitance insulating layer 126; and a silicon oxide layer 128.

As shown in the figure, four lightly-doped source/drain regions 129, 129, 129, 129 are formed underneath the sidewalls of the gate electrodes 121, 121, and three heavily-doped source/drain regions 130, 130, 130 are formed outside the source/drain regions 129, 129, 129, 129. The storage node 125 is brought into contact with two of these three source/drain regions 130, 130, 130 (i.e., the leftmost source/drain region 130 and the rightmost source/drain region 130 in the figure), and the bit line 123 is brought into contact with the remaining source/drain region 130 (i.e., the intermediate source/drain region 130).

Figure 2A:
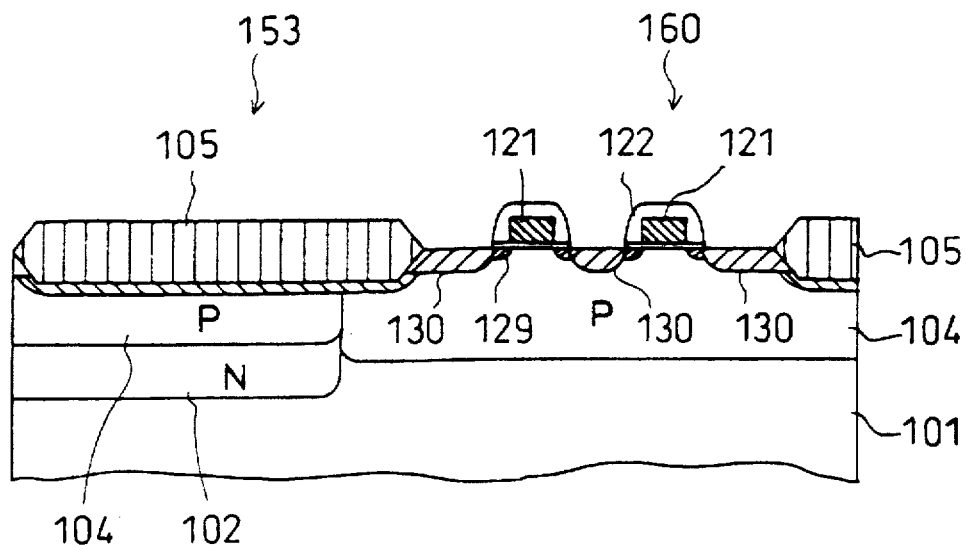
FIGS. 2a–2b show in cross section steps of the fabrication of a semiconductor device of the first embodiment.
Figure 2B:
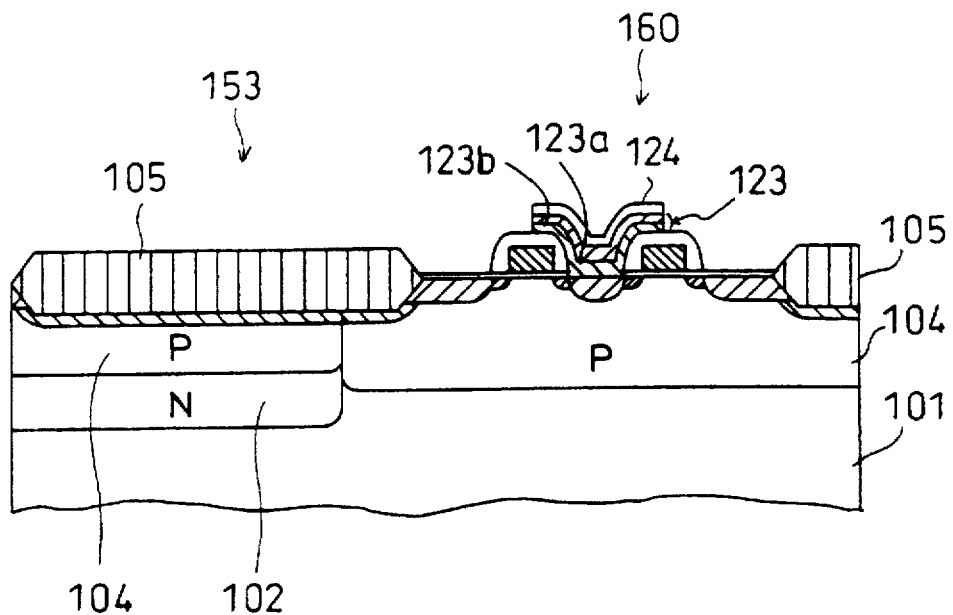

Referring now to FIGS. 2a–2b as well as to FIGS. 3a–3c, how the present semiconductor device is fabricated will be explained. These figures each show in cross section the DRAM cell 160 and the capacitance element 153 of the analog circuit 150. Neither the resistance element 151 nor the NMOS transistor 152 is shown.

As shown in FIG. 2a, on the side of the capacitance element 153, the n-type well 102 is formed in the semiconductor substrate 101, and the p-type well 104 is formed on the n-type well 102. On the side of the DRAM cell 160, the p-type well 104 is formed in the silicon substrate 101. Subsequently, the field oxide layer 105 is deposited on the p-type well 104. A first-level poly-Si layer is deposited. The gate electrode 121 1s formed. At this point in the process, the p-type well 104 is doped to form each source/drain region 129, 129, 129, 129 of low impurity concentration. Subsequently, the silicon oxide layer 122 is deposited to cover the gate electrode 121. Using portions of the silicon oxide layer 122 formed on the sidewalls of the gate electrode 121 as a mask, the p-type well 104 is doped with an impurity (ions of arsenic) so as to form each source/drain region 130, 130, 130 of high impurity concentration.

Next, as shown in FIG. 2b, a second-level poly-Si layer 123a and the WSi layer 123b are deposited in that order to form the bit line 123 having a polycide structure. Subsequently, the protective layer 124 made up of silicon oxide is formed.

Figure 3A:
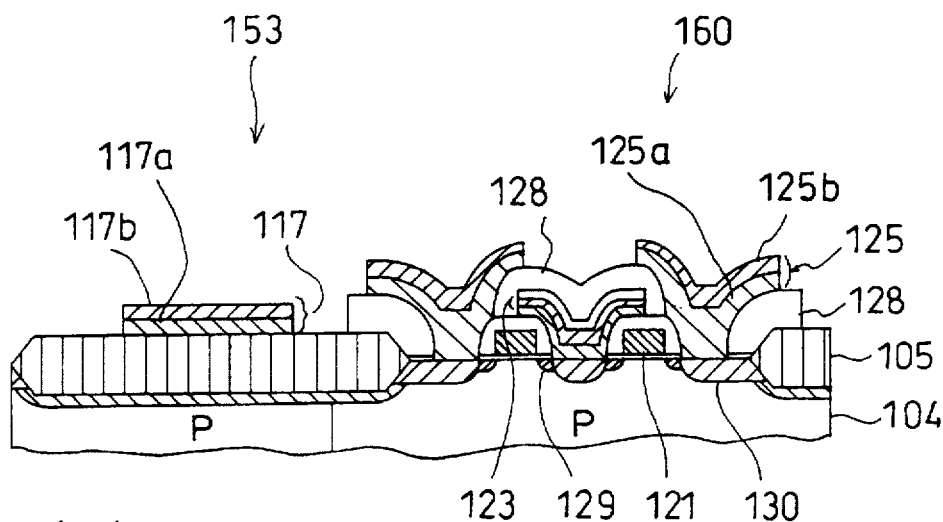
FIGS. 3a–3c show in cross section steps of the fabrication of a semiconductor device of the first embodiment.

Next, as shown in FIG. 3a, the silicon oxide layer 128 is formed in such a way as to cover the gate electrode 121, the bit line 123, and the field oxide layer 105. Subsequently, a third-level poly-Si layer 125a is formed on the silicon oxide layer 128 in order that the formed third-level poly-Si layer 125a passes through the silicon oxide layer 128 to touch two of the source/drain regions 130, 130, 130 (i.e., the leftmost and rightmost source/drain regions 130, 130). An a-Si layer 125b is deposited on the third-level poly-Si layer 125a. The third-level poly-Si layer 125a and the a-Si layer 125b together constitute the storage node 125 having a structure with double level of poly-Si and a-Si. At the same time, on the side of the capacitance element 153, a third-level poly-Si layer 117a and an a-Si layer 117b are deposited in that order so as to form the capacitance lower-electrode 117 having a structure with double level of poly-Si and a-Si. Both the third-level poly-Si layer 125a and the third-level poly-Si layer 117a are doped with phosphorus ions.

Figure 3B:
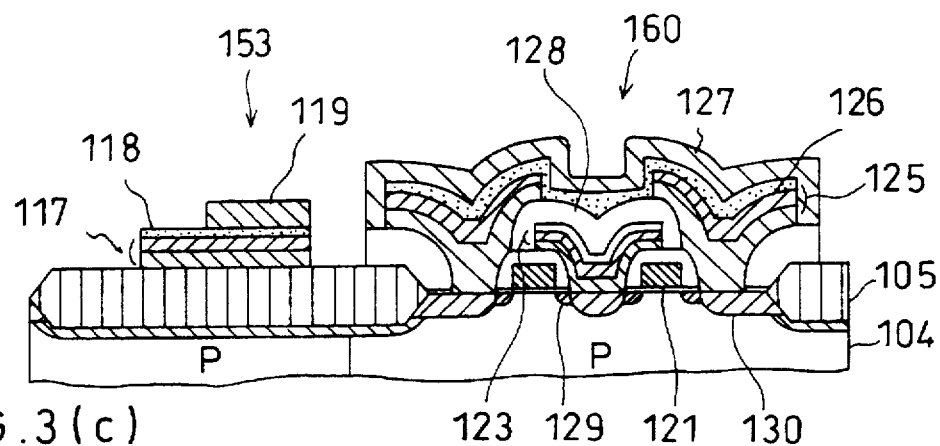

As shown in FIG. 3b, Si₃N₄ is deposited on the a-Si layer 125b as well as on the a-Si layer 117b. These formed Si₃N₄ layers are oxidized to form the capacitance insulating layers 118 and 126. Subsequently, a fourth-level poly-Si layer is deposited on the capacitance insulating layer 118 as well as on the capacitance insulating layer 126 at the same time. This fourth-level poly-Si layer is patterned, whereby the capacitance upper-electrode 119 of the capacitance element 153 and the plate electrode 127 of the DRAM cell 160 are formed.

Figure 3C:
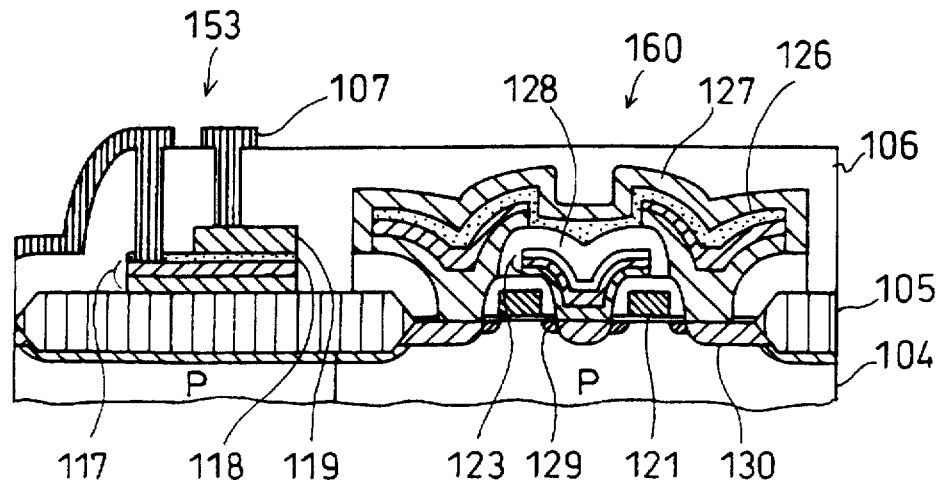

Next, as shown in FIG. 3c, a BPSG layer is deposited over the entire surface of the silicon substrate 101 to form the first interlayer dielectric film 106. Subsequently, contact holes are formed in the first interlayer dielectric film 106 for access to the capacitance lower-electrode 117 and to the capacitance upper-electrode 119. Then, an alloy of Al and Ti is deposited on the first interlayer dielectric film 106 to form the first wiring layer 107.

In subsequent steps of the fabrication of the first semiconductor device (not shown), the second interlayer dielectric film 108, the second wiring layer 109, the third interlayer dielectric film 110, and the third wiring layer 111 are formed.

The resistance body 112 of the resistance element and the storage node 125 of the DRAM cell 160 are concurrently formed (not shown in FIGS. 2a–2b and 3a–3c). In other words, two layers (i.e., a third-level poly-Si layer and an a-Si layer) together forming the resistance element body 112, and the storage node 125 are deposited at the same time. Likewise, the gate electrode 113 of the NMOS transistor 152 and the gate electrode 121 of the DRAM cell 160 are concurrently formed. In other words, the gate electrode 113 and the gate electrode 121 are deposited at the same time.

In the present embodiment, the analog circuit 150 composed of plural circuits having different functions and the DRAM cell 160 are mounted on the silicon substrate 101. This system-on-chip technique reduces the occupied area by the analog circuit, speeds up the rate of operation by reducing the length of the interconnection signal lines, and provides lower-power semiconductor devices. Further, the fabrication of the semiconductor device is simplified thereby cutting down production costs.

Particularly, the resistance body 112 of the resistance element 151, the capacitance lower-electrode 117 of the capacitance element 153, and the storage node 125 of the DRAM cell 160 are formed by the concurrently deposited silicon layers (i.e., the third-level poly-Si layers and the a-Si layers). This considerably cuts down the number of semiconductor fabrication steps.

An inductor of the inductance element may be formed by the aforesaid silicon layers.

In accordance with the first embodiment, the storage node 125 of the DRAM cell 160, the resistance body 112 of the resistance element 151, and the capacitance lower-electrode 117 of the capacitance element 153 are formed by the concurrently deposited silicon layers. However, a poly-Si layer may be deposited to form either the resistance body 112 or the capacitance lower-electrode 117 having a single- or double-level structure, at the time when either a first-level poly-Si layer forming the gate electrode (word line) 121 of the DRAM cell 160 or a second-level poly-Si layer (or double level of a second-level poly-Si layer and a WSi layer) forming the bit line 123 is formed.

In the present embodiment, the storage node 125 has a double-level structure. However, the storage node 125 may be formed by a single poly-Si layer or by three or more layers. In the present embodiment, the capacitance lower-electrode 117 of the capacitance element 153 has a surface zone formed by an a-Si layer (i.e., an amorphous semiconductor layer). This creates a smooth interface, so that the leak and breakdown characteristics of the capacitance insulating layer and dependence of the capacitance upon the applied voltage are improved.

Since the resistance body 112 of the resistance element 151 has a surface zone formed by a-Si, this provides high-precision resistance bodies.

In accordance with the present embodiment, the NMOS transistor 152 of the analog circuit 150 has an LDD structure. This controls the drop in mutual conductance and provides an analog circuit MOS transistor structure suitable for miniaturization in which the drain depletion layer affects no channels.

EXAMPLE 2

Figure 4:
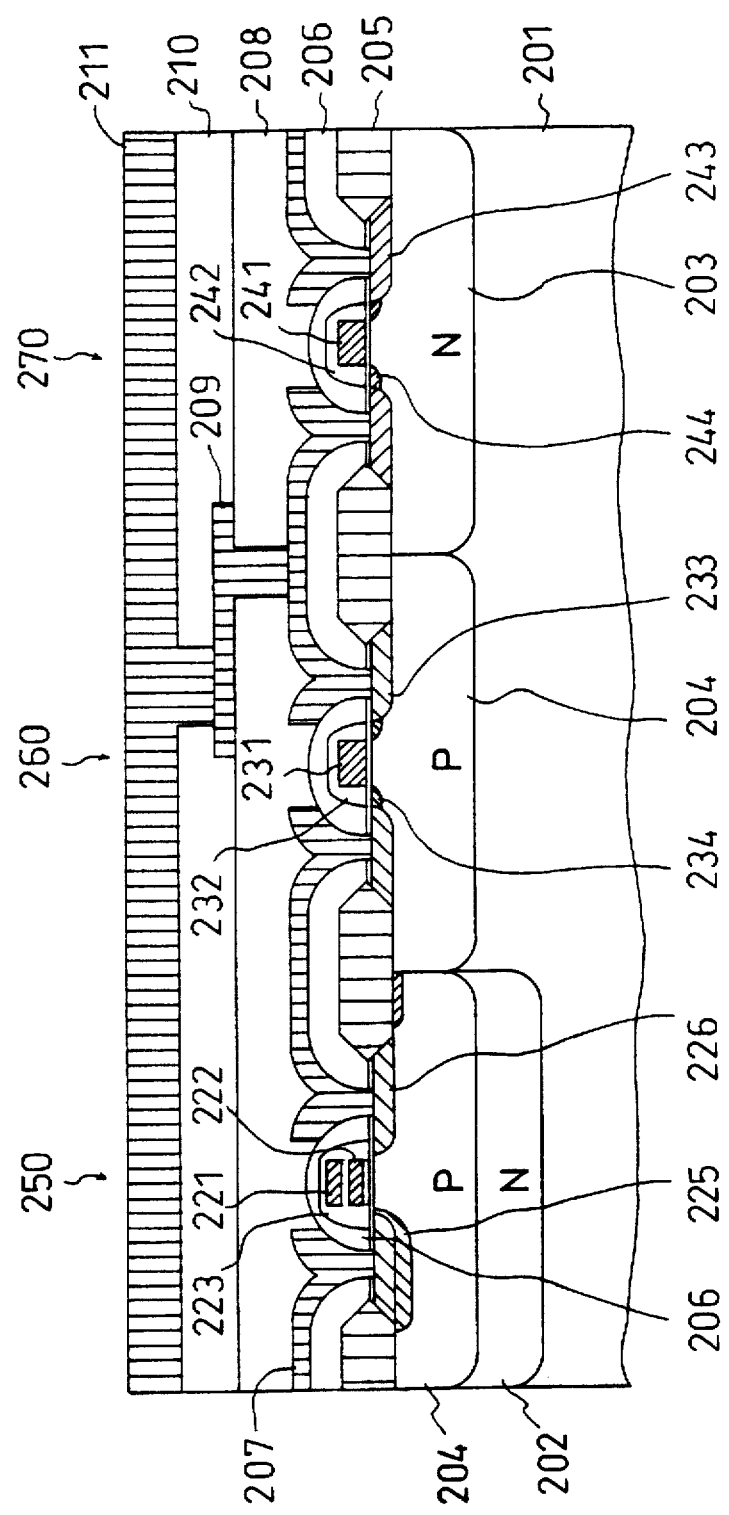
FIG. 4 shows in cross section a semiconductor device in accordance with a second embodiment of the present invention.

FIG. 4 shows in cross section a second semiconductor device of the present invention. As shown in FIG. 4, an EEPROM cell 250, an NMOS transistor 260 in a DRAM peripheral circuit (or a digital logical circuit), and a PMOS transistor 270 are formed on a semiconductor substrate 201. A deep, n-type well 202, a p-type well 204, and an n-type well 203 are formed in the semiconductor substrate 201. The PMOS transistor 270 of the DRAM peripheral circuit is formed on the n-type well 203. A field oxide layer 205, first to third interlayer dielectric films 206, 208, and 210, and first to third wiring layers 207, 209, and 211 of the second embodiment are identical with their counterparts in the first embodiment.

The EEPROM cell 250 has the following: a control gate electrode 221 made up of a second-level poly-Si layer; a floating gate electrode 222 made up of a first-level poly-Si layer; a silicon oxide layer 223 which surrounds both the control gate electrode 221 and the floating gate electrode 222; a source/drain region 225 of low impurity concentration; and a source/drain region 226 of high impurity concentration.

The NMOS transistor 260 has the following: a gate electrode 231 which is made up of a first-level poly-Si layer and which serves as a word line; a silicon oxide layer 232 which surrounds the gate electrode 231: a source/drain region 233 of high impurity concentration; and a source/drain region 234 of low impurity concentration. The NMOS transistor 260 of the present embodiment is identical in structure with the first embodiment NMOS transistor 152.

The PMOS transistor 270 has the following: a gate electrode 241 made of a first-level poly-Si layer; a silicon oxide layer 242 that surrounds the gate electrode 241; a source/drain region 243 of high impurity concentration; and a source/drain region 244 of low impurity concentration.

In accordance with the second embodiment, the gate electrode 231 of the NMOS transistor 260, the gate electrode 241 of the PMOS transistor 270, and the floating gate electrode 222 of the EEPROM cell 250 are made of a common first-level poly-Si layer, whereby the level of integration is improved and the fabrication process is simplified.

In the second embodiment, the floating gate electrode 222 of the EEPROM cell 250 and the gate electrodes 231 and 241 that become a DRAM word line are formed by a common same material. Alternatively, the bit line, storage node, and plate electrode of the DRAM and the floating gate electrode 222 and control gate electrode 221 of the EEPROM cell 250 may be formed by a common material.

EXAMPLE 3

Figure 5:
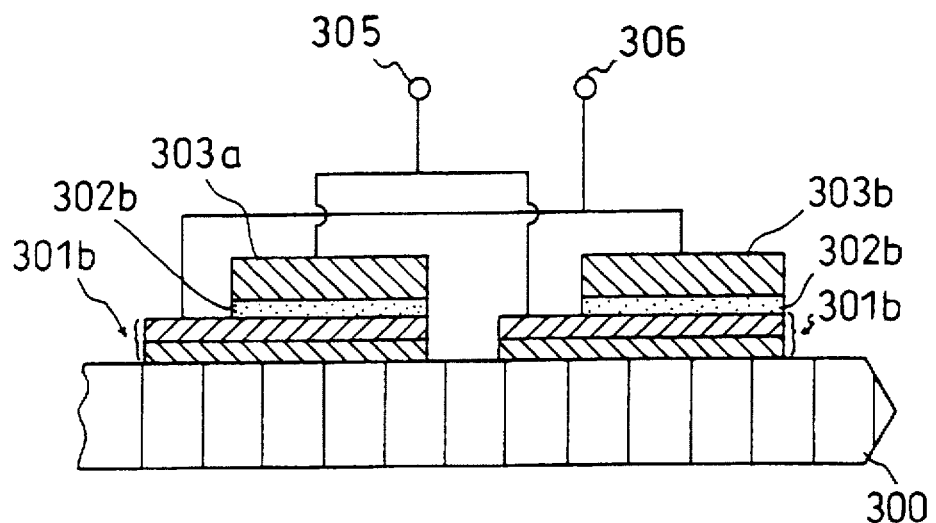
FIG. 5 shows in cross section a capacitance element section of a semiconductor device in accordance with a third embodiment of the present invention.

FIG. 5 shows a capacitance element that is a part of a third semiconductor device of the present invention. This capacitance element is divided into two sections. One of these two sections is identical in configuration with the other section. Each section is identical in configuration with the first embodiment capacitance element. More specifically, the capacitance element of the present embodiment has the following: a first capacitance lower-electrode 301a having a double-layered structure formed by a third-level poly-Si layer and an a-Si layer; a second capacitance lower-electrode 301b having a double-layered structure of a third-level poly-Si layer and an a-Si layer; a first capacitance insulating layer 302a of $Si_3N_4$ formed on the first capacitance lower-electrode 301a; a second capacitance insulating layer 302b of $Si_3N_4$ formed on the second capacitance lower-electrode 301b; a first capacitance upper-electrode 303a made of a fourth-level poly-Si layer formed on the first capacitance insulating layer 302a; and a second capacitance upper-electrode 303b made of a fourth-level poly-Si layer formed on the second capacitance insulating layer 302b. 300 indicates a field oxide layer.

Whereas the first capacitance upper-electrode 303a and the second capacitance lower-electrode 301b are connected to a first terminal 305, the first capacitance lower-electrode 301a and the second capacitance upper-electrode 303b are connected to a second terminal 305. In other words, the first capacitance upper-electrode 303a of one of the sections and the second capacitance upper-electrode 303b of the other section are connected to different terminals.

In accordance with the third embodiment, capacitance elements having opposite polarities are connected in parallel. This cancels dependence of the capacitance upon the applied voltage.

EXAMPLE 4

Figure 6:
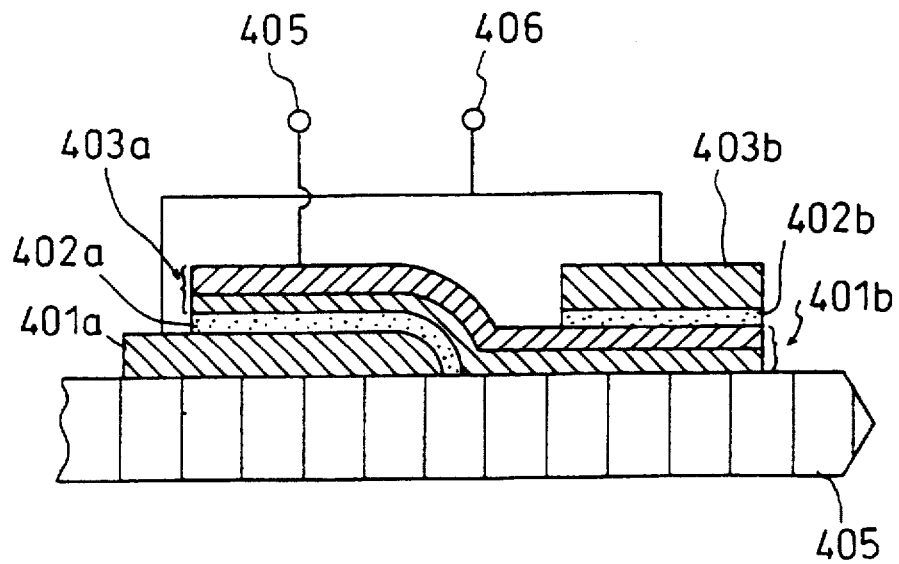
FIG. 6 shows in cross section a capacitance element section of a semiconductor device in accordance with a fourth embodiment of the present invention.

FIG. 6 shows in cross section a capacitance element of a fourth semiconductor device of the present invention. Like the third embodiment, the present capacitance element is divided into two sections. One of these sections has the following: a first capacitance lower-electrode 401a made up of a first-level poly-Si layer; a first capacitance insulating layer 402a which is made up of an oxidized $Si_3N_4$ layer and which is deposited on the first capacitance lower-electrode 401a; and a first capacitance upper-electrode 403a which is made up of a second-level poly-Si layer and its overlying a-Si layer and which is deposited on the first capacitance insulating layer 402a. On the other hand, the other section has the following: a second capacitance lower-electrode 401b made of a second-level poly-Si layer and its overlying a-Si layer; a second capacitance insulating layer 402b which is deposited on the second capacitance lower-electrode 401b and which is made up of an oxidized $Si_3N_4$ layer; and a second capacitance upper-electrode 403b which is deposited on the second capacitance insulating layer 402b and which is made up of a third-level poly-Si layer. To sum up, the entire capacitance element has at least three individually-deposited conductive layers. One of these conductive layers having a double-layered structure made up of a second-level poly-Si layer and its overlying a-Si layer is deposited in such a way as to cover both the sections, to serve as the first capacitance upper-electrode 403a and as the second capacitance lower-electrode 401b.

In comparison with the third embodiment, the fourth embodiment is able to provide wiring with a simpler structure with respect to a first terminal 405. In FIG. 6, 400 indicates a field oxide layer, and 406 indicates a second terminal.

Figure 7:
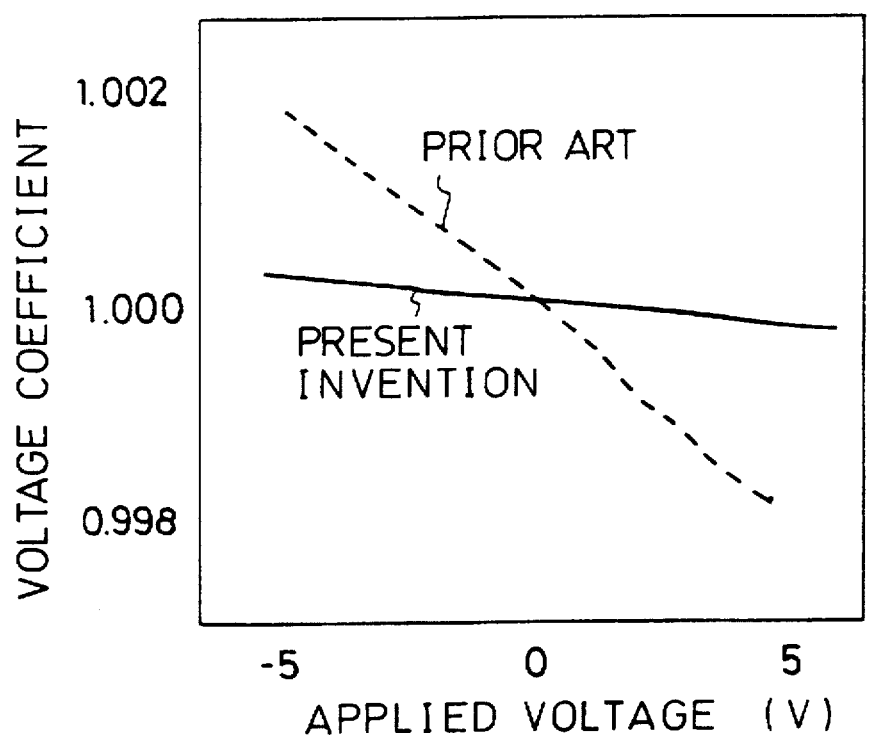
FIG. 7 makes comparison in voltage dependence of the voltage coefficient between a capacitance element of the third or the fourth embodiment and a conventional capacitance element.

FIG. 7 compares the applied-voltage dependence of a conventional capacitance element with the applied-voltage dependence of a capacitance element of the present invention (the third and fourth embodiments). In FIG. 7, the present invention is indicated by solid line, while the prior art is indicated by broken line. As seen from FIG. 7, the present invention undergoes only a considerably little change in the voltage coefficient. This means that the applied-voltage dependence of the capacitance element of the present invention is remarkably reduced. This enables the miniaturization of capacitance elements while maintaining their required capacitance by reducing the film thickness of capacitance insulating layers. This improves the level of analog circuit integration.

In accordance with the fourth embodiment, the first capacitance upper-electrode 403a and the second capacitance lower-electrode 401a have a double-layered structure of an a-Si layer over a poly-Si layer, which is not to be considered restrictive. However, use of an a-Si layer to form an electrode surface zone creates a smooth interface between an oxidized $Si_3N_4$ layer and such an a-Si layer, whereby the leak characteristic/breakdown voltage of the capacitance insulating layer of oxidized $Si_3N_4$, and the applied-voltage dependence of the capacitance are improved. This enables the miniaturization of resistance elements while maintaining good resistance characteristics, thereby improving the level of analog circuit integration.

If the aforesaid capacitance element is formed on a field oxide layer having a thick film thickness, this further lessens the applied-voltage dependence.

Figure 8:
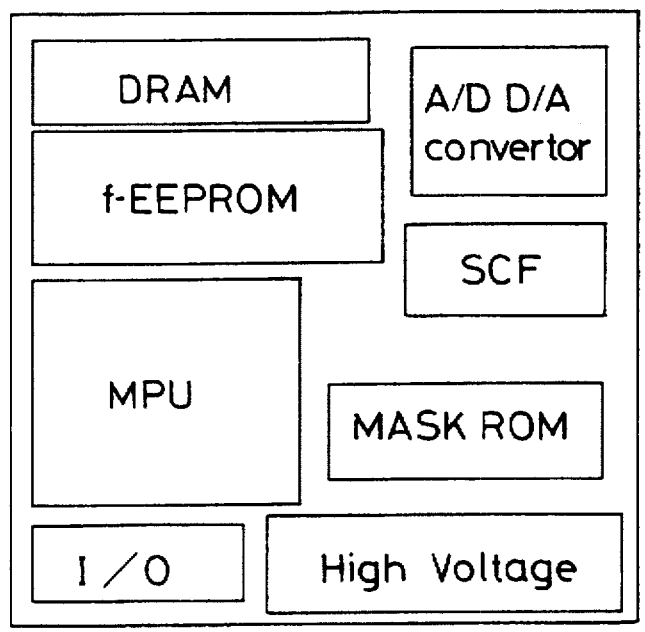
FIG. 8 is a diagram representing an example of a semiconductor device by the present invention in which various circuits are mounted onto a single chip.

Various types of circuits other than those in the foregoing embodiments may be mounted on a single chip. An example is shown in FIG. 8. When mounting, for example, a DRAM, an A/D (or D/A) converter, an f-EEPROM, an SCF, a MASK-ROM, an I/O unit, and a high-voltage circuit on a single chip (see FIG. 8), their respective conductive layers are formed by the same layer. This simplifies not only the structure of semiconductor devices but also the fabrication process of semiconductor devices. This system-on-chip technique improves the level of semiconductor device integration and increases the rate of operation.

Although not described in the foregoing embodiments, the present invention is applicable in inductance elements and bipolar transistors. For example, an inductor's conductive layer and a different circuit's conductive layer may be formed by a single common layer (e.g., a poly-Si layer).

There are cases where a 3V–5V I/O interface circuit is connected between a 3V DRAM semiconductor device and an external 5V device. In such a case, a transistor forming such an interface circuit requires a gate oxide layer thick enough to withstand high voltages. On the other hand, a transistor forming a peripheral circuit of the 3V DRAM usually receives an application of 3 V and may receive an application of a high peak voltage of about 4.8 V. If the gate oxide layer of the transistor forming the peripheral circuit of the DRAM and the gate oxide layer of the transistor forming the I/O interface circuit are formed by the same layer having a thick film thickness, this allows the transistor to withstand the aforesaid high peak voltage. As a result, the reliability of the semiconductor devices is improved.

EXAMPLE 5

FIG. 12 shows in cross section a fifth semiconductor device of the present invention. An insulator 502 of oxide for electric isolation between transistors is formed having a film thickness of 500 nm on a p-type semiconductor substrate 501, formed on a part of the p-type semiconductor substrate 501 not covered with the insulator 502 is a thin-film transistor as a first transistor. In FIG. 12, an example of this thin-film transistor is shown in the form of an n-channel transistor. The FIG. 12 n-channel transistor has the following: a gate oxide layer 503; a first polysilicon gate electrode 504a; n-type diffusion layers 505a, 505b of low impurity concentration; and n-type diffusion layers 510a, 510b of high impurity concentration. The gate oxide layer 503 has a film thickness of 10 nm. The first polysilicon gate electrode 504a has a film thickness of 300 nm. Whereas the n-type diffusion layer 505a and the n-type diffusion layer 510a function as the source of the n-channel transistor, the n-type diffusion layer 505b and the n-type diffusion layer 510b function as the drain of the n-channel transistor. Generally, a p-type transistor (not shown in FIG. 12) is formed on the p-type semiconductor substrate 501.

A first Ti silicide layer 514a is formed on the first polysilicon gate electrode 504a. A second Ti silicide layer 514b is formed on the n-type diffusion layer 510a, 510b. Formed on the sidewalls of the first polysilicon gate electrode 504a is a sidewall insulating layer 508a.

As shown in the figure, a capacitance insulating layer 508b serving as an insulating region which becomes a capacitor is formed on a part of a second polysilicon gate electrode 504b as well as on a part of the insulator 502. A third Ti silicide layer 514c is formed on a part of the n-type diffusion layer 510b, on a part of the capacitance insulating layer 508b, and on a part of the second polysilicon gate electrode 504b. The third Ti silicide layer 514c is electrically connected with the n-type diffusion layer 510b. The third Ti silicide layer 514c and the second polysilicon gate electrode 504b are not electrically connected together because the capacitance insulating layer 508b is formed between them.

Referring now to the drawing figures, how a semiconductor device of the fifth embodiment is fabricated will be described below.

Figure 9:
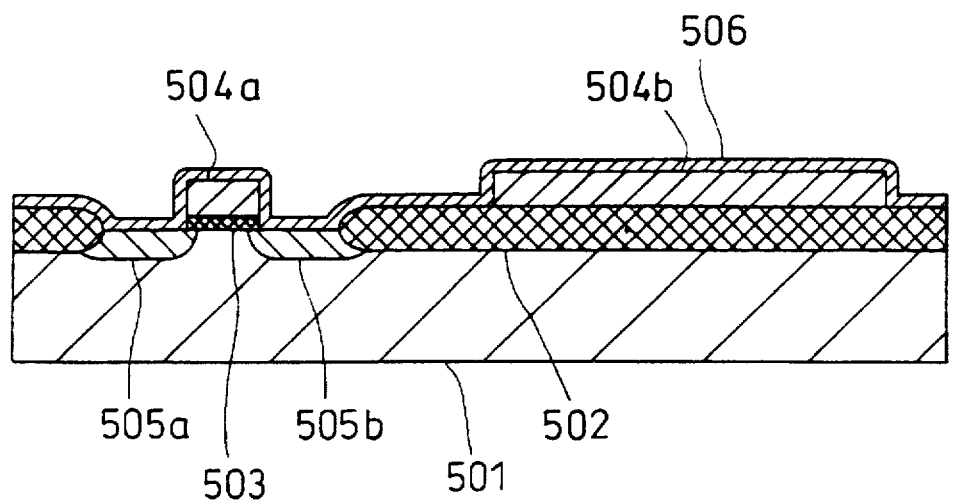

First, as shown in FIG. 9, the insulator 502 is formed having a film thickness of 500 nm on the p-type semiconductor substrate 501. The insulator 502 is for isolation between transistors and is formed by means of a LOCOS (local oxidation of silicon) process. The gate oxide layer 503 is formed having a film thickness of 10 nm. The first and second polysilicon gate electrodes 504a and 504b are formed each having a film thickness of 300 nm. Phosphorous is heavily diffused into the first and second polysilicon gate electrodes 504a and 504b. Implantation of ions of phosphorous is performed using the first polysilicon gate electrode 504a as a mask, to form the n-type diffusion layers 505a, 505b for an LDD structure. Subsequently, a p-type diffusion layer of low impurity concentration for an LDD structure is formed in a p-channel transistor region using a polysilicon gate electrode for a p-channel transistor as a mask, which is not shown in FIG. 6. Thereafter, an insulating layer 506 used for sidewall formation is deposited having a film thickness of 100 nm.

Figure 10:
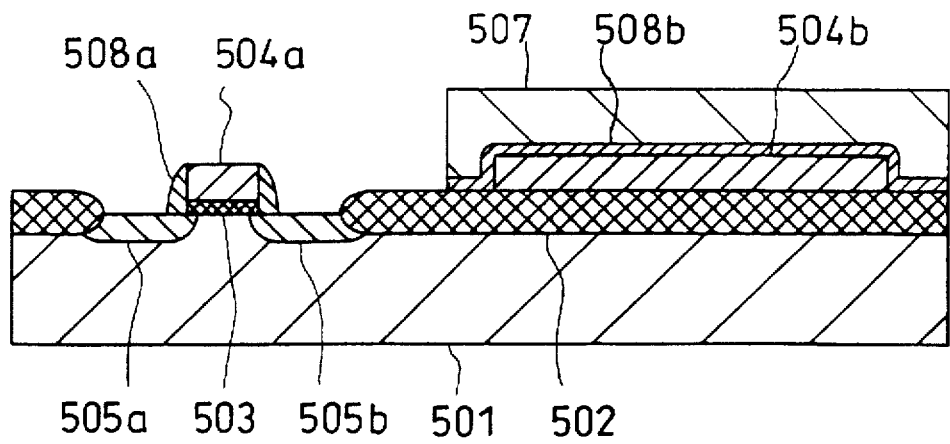

Next, as shown in FIG. 10, a resist pattern 507 is formed. Using the formed resist pattern 507 as a mask, the insulating layer 506 is etched anisotropically by a dry etching process (e.g., RIE) to form the sidewall insulating layer 508a and the capacitance insulating layer 508b.

Next, as shown in FIG. 11, implantation of ions of arsenic is performed using the first polysilicon gate electrode 504a and the sidewall insulating layer 508a as a mask, and a heat treatment is performed at a temperature of 850° C., whereupon the n-type diffusion layers 510a, 510b of high impurity concentration are formed. Subsequently, implantation of ions of $BF_2$ is performed to a p-channel transistor region using a polysilicon gate electrode for a p-channel transistor as a mask, to form a p-type diffusion layer of high impurity concentration that becomes a source/drain region, which is not shown in FIG. 11. Then, a Ti thin film 511 and an amorphous Si thin film 512 are formed. A resist pattern 513 is formed on the amorphous Si thin film 512. The amorphous Si thin film 512 is etched with the aid of the resist pattern 513.

Next, as shown in FIG. 12, a siliciding heat treatment is performed to react the Ti thin film 511 with the amorphous Si thin film 512, whereupon the first to third Ti silicide layers 514a, 514b, 514c are formed. An etching treatment with sulfuric is performed to remove unreacted Ti and TiN. This electrically connects the n-type diffusion layer 510b and the third Ti silicide layer 514c. On the other hand, the third Ti silicide layer 514c and the second polysilicon gate electrode 504b are not electrically connected together because of the existence of the capacitance insulating layer 508b between the third Ti silicide layer 514c and the second polysilicon gate electrode 504b. Subsequently, an interlayer dielectric film, a contact hole, and an aluminum wiring layer, and a surface protective layer are formed one after another to complete a semiconductor device.

As shown in FIG. 12, the third Ti silicide layer 514c is isolated by the capacitance insulating layer 508b from the second polysilicon gate electrode 504b. This forms a parallel-plate capacitor, wherein the third Ti silicide layer 514c and second polysilicon gate electrode 504b serve as electrodes and the capacitance insulating layer 508b serves as a dielectric. This parallel-plate capacitor has no bias-dependence, since neither the third Ti silicide layer 514c nor the second polysilicon gate electrode 504b has a depletion layer. Further, the capacitance insulating layer 508b has a film thickness of 100 nm which is 1/2 to 1/10 of that of an interlayer dielectric film for wiring, so that this parallel-plate capacitor has a capacitance density seven to ten times that of a capacitor formed by a conventional interlayer dielectric film for wiring.

The formation of capacitors having no bias dependence is a key to the mounting of high-precision analog circuits onto CMOS LSIs. In accordance with the fifth embodiment, a part of the insulating layer 506, used to form the sidewall insulating layer 508a of the first polysilicon gate electrode 504a of an LDD-type MOS transistor, is left on the second polysilicon gate electrode 504b as the capacitance insulating layer 508b, whereupon the aforesaid parallel-plate capacitor is formed. This enables the mounting of capacitors with a capacitance density seven to ten times that of a conventional one. Therefore, it is possible to provide a high-speed LSI with high-precision analog circuits.

In the fifth embodiment, the third Ti silicide layer 514c is used as a local wiring layer. Instead of the third Ti silicide layer 514c, a TiN layer may be employed. Further, in the fifth embodiment, the Ti thin film 511 is formed before the amorphous Si thin film 512 is formed in order that the third Ti silicide layer 514c serves as a local wiring layer. In the case of using a TiN layer as a local wiring layer, however, after the deposition of Ti thin film 511, a siliciding heat treatment is performed in order that the first and second Ti silicide layers 514a, 514b are formed on only the first polysilicon gate 504a, the n-type diffusion layers 510a, 501b, and a p-type diffusion layer of high impurity concentration (not shown). At this point in the process, a Ti thin film 511 not used to form the first and second Ti silicide layers 514a, 514b forms a TiN layer. Such a formed Tin layer is patterned by a photo-etching treatment to form a local wiring layer.

Further, in the fifth embodiment, the third Ti silicide layer 514c and the n-type diffusion layer 510b are electrically connected together; however, they may not be connected electrically or may be connected by means of aluminum metallization.

EXAMPLE 6

Figure 16:
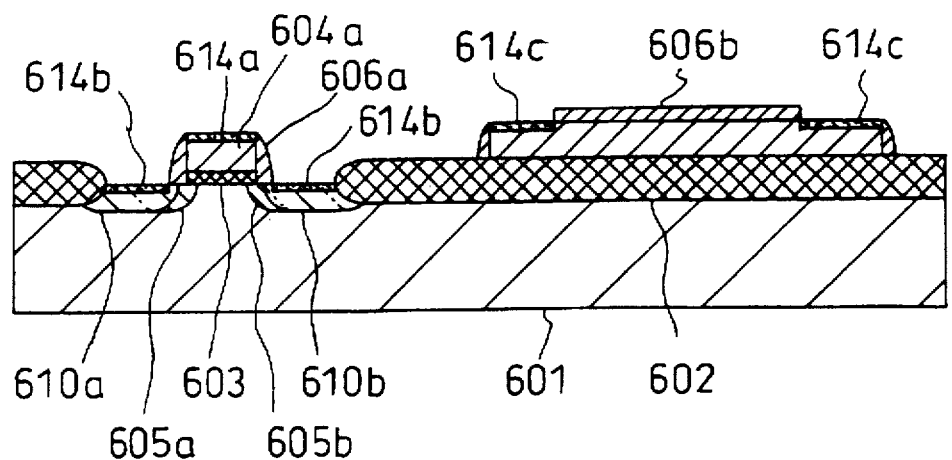

FIG. 16 shows in cross section a sixth semiconductor device of the present invention. To provide isolation between transistors, an insulator 602 of oxide is formed having a film thickness of 500 nm on a p-type semiconductor substrate 601. A thin-film transistor as a first transistor is formed on a part of the p-type semiconductor substrate 601 not covered with the insulator 602. An example of this thin-film transistor is shown in FIG. 16 in the form of an n-channel transistor. The n-channel transistor is made up of the following: a gate oxide layer 603; a first polysilicon gate electrode 604a; n-type diffusion layers 605a, 605b of low impurity concentration; and n-type diffusion layers 610a, 610b of high impurity concentration. The gate oxide layer 603 has a 10 nm film thickness and the first polysilicon gate electrode 604a has a 300 nm film thickness. The n-type diffusion layers 605a and 610a together form the source of the n-channel transistor. The n-type diffusion layers 605b and 610b together form the drain of the n-channel transistor. Generally, a p-channel transistor (not shown in the figure) is formed on the p-type semiconductor substrate 601.

A first Ti silicide layer 614a is formed on the first polysilicon gate electrode 604a. A sidewall insulating layer 606a is formed on the sidewalls of the first polysilicon gate electrode 604a. A second Ti silicide layer 614b is formed on the n-type diffusion layers 610a, 610b.

A second polysilicon gate electrode 604b forming a second transistor is formed on the insulator 602. A silicidation prevention insulating layer 606b is formed locally on the second polysilicon gate electrode 604b, to prevent the occurrence of silicidation reaction. A third Ti silicide layer 614c is formed on a part of the second polysilicon gate 604b not covered with the silicidation prevention insulating layer 606b.

Referring now to the drawing figures, how the sixth semiconductor device of the present invention is fabricated will be described below.

Figure 13:
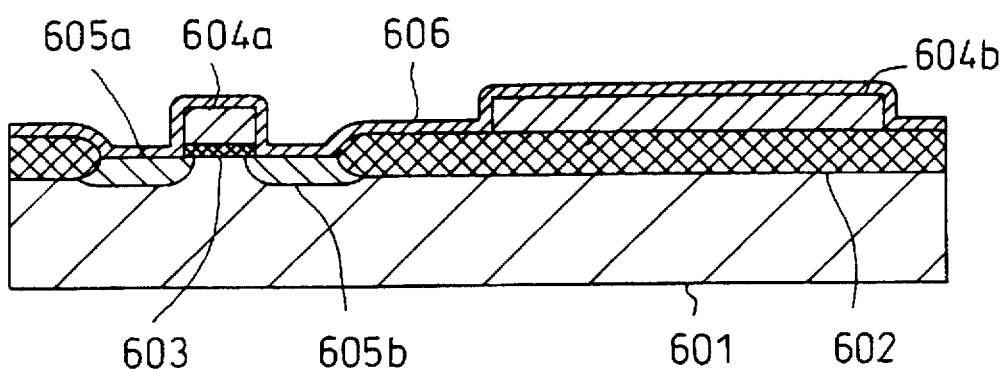
FIGS. 13–16 show in cross section steps of the fabrication of a semiconductor device in accordance with a sixth embodiment of the present invention.

In the first place, as shown in FIG. 13, the insulator 602 is deposited 500 nm on the p-type semiconductor substrate 601. The insulator 601 is for isolation between transistors and is formed by means of a LOGOS (local oxidation of silicon) process. The gate oxide layer 603 is formed having a film thickness of 10 nm. The first and second polysilicon gate electrodes 604a and 604b are formed each having a film thickness of 300 nm. Subsequently, phosphorous of high concentration is diffused into the first and second polysilicon gate electrodes 604a and 604b. Implantation of ions of phosphorous is performed using the first polysilicon gate electrode 604a as a mask, to form the n-type diffusion layers 605a, 605b for an LDD structure. Then, a p-type diffusion layer of low impurity concentration for an LDD structure is formed in a p-channel transistor region using a polysilicon gate electrode for a p-channel transistor as a mask, which is not shown in FIG. 13. Thereafter, an insulating layer 606 used for sidewall formation is formed having a film thickness of 100 nm.

Figure 14:
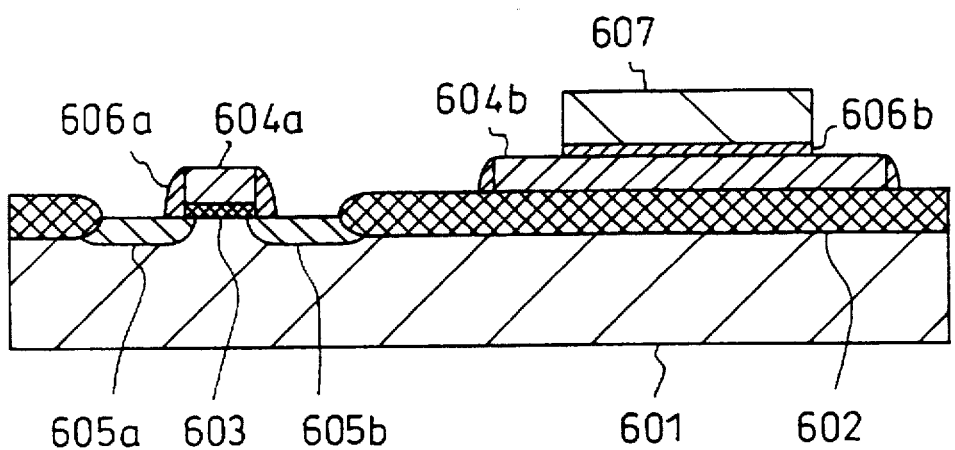

Next, as shown in FIG. 14, a resist pattern 607 is formed. Using the resist pattern 607 as a mask, the insulating layer 606 is etched anisotropically by a dry etching process (e.g., RIE) to form the sidewall insulating layer 606a and the silicidation prevention insulating layer 606b.

Figure 15:
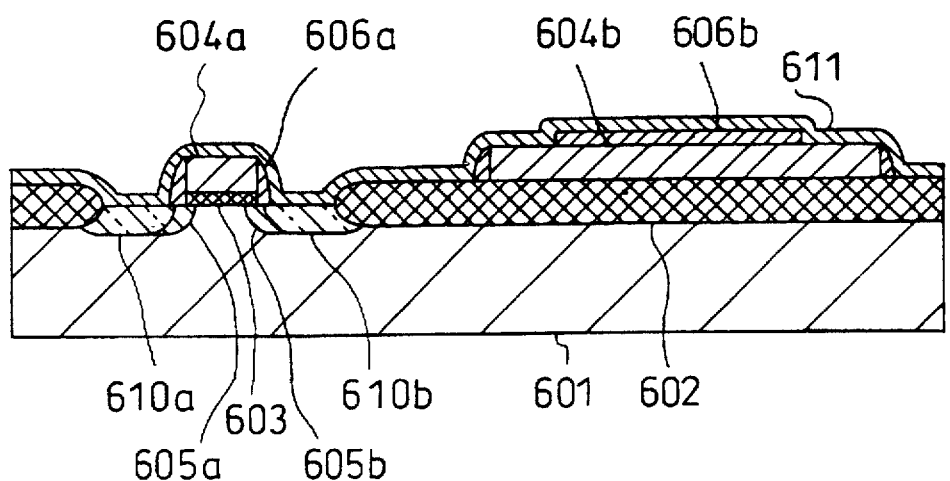

Next, as shown in FIG. 15, implantation of ions of arsenic is performed using the first polysilicon gate electrode 604a and the sidewall insulating layer 606a as a mask, and a heat treatment is performed at a temperature of 850° C. to form the n-type diffusion layers 610a, 610b. implantation of ions of $BF_2$ is performed in a p-channel transistor region using a polysilicon gate electrode for a p-channel transistor as a mask, to form a p-type diffusion layer of high impurity concentration that becomes a source/drain region, which is not shown in FIG. 15. This is followed by the deposition of a Ti thin film 611.

As shown in FIG. 16, a siliciding heat treatment is performed to react the Ti thin film 611 with the first polysilicon gate electrode 604a, with the n-type diffusion layers 610a, 610b, and with the second polysilicon gate electrode 604b, whereupon the first to third Ti silicide layers 614a, 614b, 614c are formed. An etching treatment with sulfuric is performed to selectively get rid of unreacted Ti and TiN. The first and third Ti silicide layers 614a and 614c are formed on the first and second polysilicon gate electrodes 604a and 604b, respectively; however, the third Ti silicide layer 614c is not formed on the silicidation prevention insulating layer 608b. Subsequently, an interlayer dielectric film, a contact hole, and an aluminum wiring layer, and a surface protective layer are formed one after another to complete a semiconductor device.

The sheet resistance of the first polysilicon gate electrode 604a covered with the first Ti silicide layer 614a is about 3–5 Ω/□. The sheet resistance of the second polysilicon gate electrode 604b partly covered with the third Ti silicide layer 614c is about 30–50 Ω/□. The second polysilicon gate electrode 604b has a sheet resistance about ten times that of the first polysilicon gate electrode 604a.

The mounting of high-precision analog circuits on CMOS LSIs requires resistance bodies having an electrical resistance of several hundred ohms to several thousand ohms. However, in accordance with conventional Ti-silicide-layer formation techniques, a Ti silicide layer is formed on every polysilicon gate electrode. Therefore, preparing a resistance body having an electrical resistance of from several hundred ohms to several thousand ohms results in consuming a greater area. In contrast, in accordance with the sixth embodiment, the insulating layer 606, deposited to form the sidewall insulating layer 606a, is left on a part of the second polysilicon gate electrode 604b, as the silicidation prevention insulating layer 606b. This keeps the second polysilicon gate electrode 604b from entirely being covered with the third Ti silicide layer 614c. Such an arrangement enables the mounting of resistance bodies having a tenfold electrical resistance in comparison with a conventional technique, thereby providing high-speed, high-density LSIs employing high-precision analog circuits.

In the sixth embodiment, a wiring layer made up of a Ti silicide layer is not formed. However, connection with the second Ti silicide layer 614b may be established by a wiring pattern made up of a Ti silicide layer. In the case of using a Ti silicide layer as a local wiring layer, after the deposition of the Ti thin film 611, the amorphous Si thin film 612 is formed, and a siliciding heat treatment is performed, and an etching treatment with sulfuric is performed to get rid of unreacted Ti and TiN. On the other hand, in the case of using a TiN layer as a wiring layer, after the deposition of the Ti thin film 611, a siliciding heat treatment is performed to form a resist pattern for wiring, and unreacted Ti and TiN layers are removed by a dry or sulfuric etching treatment using the formed resist pattern as a mask.

EXAMPLE 7

Figure 19:
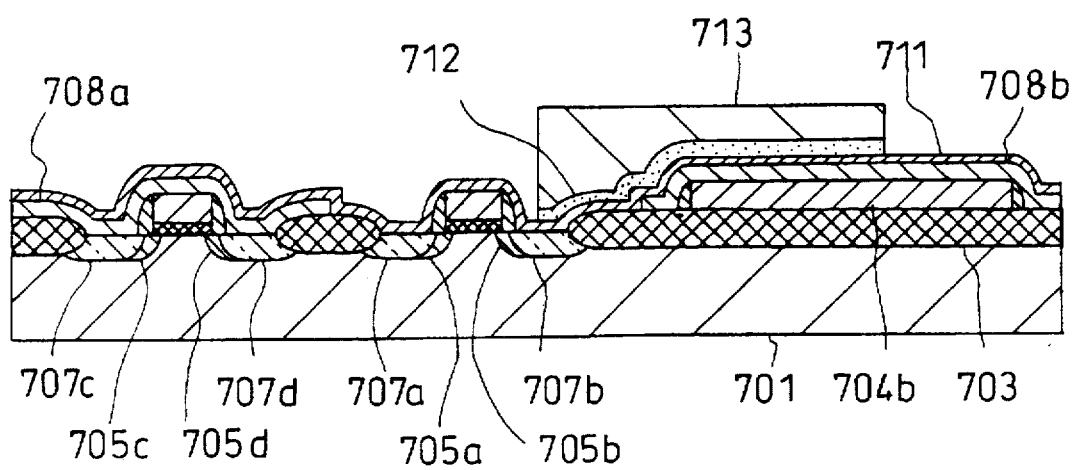
Figure 20:
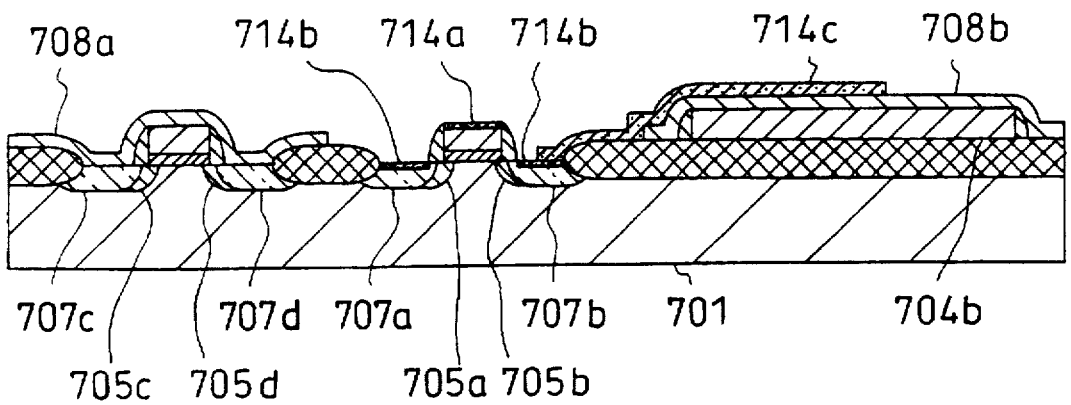

FIG. 20 shows in cross section a seventh semiconductor device of the present invention. For isolation between transistors, an insulator 702 of oxide having a film thickness of 500 nm is formed on a p-type semiconductor substrate 701. A thin-film transistor as a first transistor is formed on the part of the p-type semiconductor substrate 701 not covered by the insulator 702. An example of this thin-film transistor is shown in FIG. 19 in the form of an n-channel transistor. The n-channel transistor is made up of the following: a gate oxide layer 703; a first polysilicon gate electrode 704a; n-type diffusion layers 705a, 705b of low impurity concentration; and n-type diffusion layers 707a, 707b of high impurity concentration. The gate oxide layer 703 has a 10 nm film thickness and the first polysilicon gate electrode 704a has a 300 nm film thickness. Whereas the n-type diffusion layers 705a and 707a together form the source of the n-channel transistor, the n-type diffusion layers 705b and 707b together form the drain of the n-channel transistor. Generally, a p-channel transistor (not shown in the figure) is formed on the p-type semiconductor substrate 701.

A first Ti silicide layer 714a is formed on the first polysilicon gate electrode 704a. A sidewall insulating layer 706 is formed on the sidewalls of the first polysilicon gate electrode 704a. A second Ti silicide layers 714b is formed on the n-type diffusion layers 707a, 707b.

A first non-silicide-region forming oxide layer 708a as a silicidation prevention layer is formed on a third polysilicon gate electrode 704c, n-type diffusion layers 705c, 705d of low impurity concentration, and n-type diffusion layers 707c, 707d of high impurity concentration together forming an outermost pad drive transistor of the p-type semiconductor substrate 701. This oxide layer 708a prevents the gate electrode 704c, the layers 705c, 705d, and the layers 707c, 707d from undergoing silicidation, so that the breakdown voltage of the outermost transistor is improved.

A second non-silicide-region forming oxide layer 708b is formed on a part of a second polysilicon gate electrode 704b which is formed on the insulator 702 and which forms a second transistor and on a part of the insulator 702. The third Ti silicide layer 714c is formed on a part of the n-type diffusion layer 707b, on a part of the insulator 702, on a part of the oxide layer 708b, and on a part of the second polysilicon gate electrode 704b. The third Ti silicide layer 714c and the n-type diffusion layer 707b are electrically connected together. The third Ti silicide layer 714c and the second polysilicon gate electrode 704b are not electrically connected together because of the existence of the oxide layer 708b between them.

Referring now to the drawing figures, how the seventh semiconductor device of the present invention is fabricated will be described below.

Figure 17:
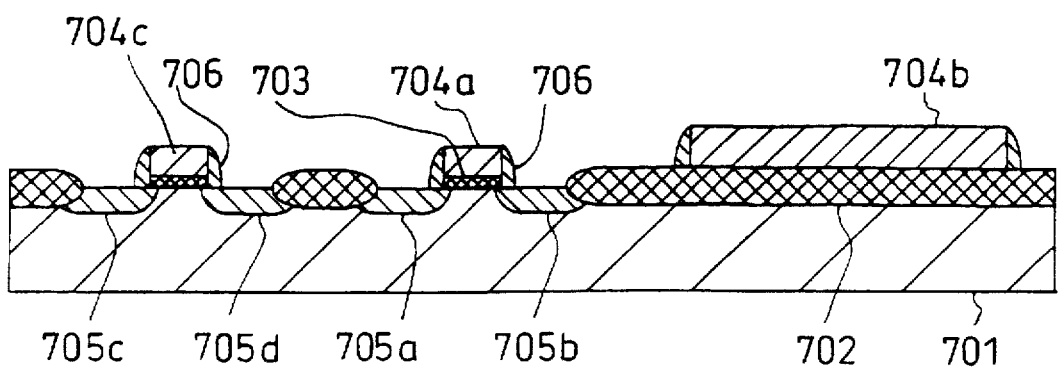
FIGS. 17–20 show in cross section steps of the fabrication of a semiconductor device in accordance with a seventh embodiment of the present invention.

As shown in FIG. 17, the insulator 702 is formed having a film thickness of 500 nm on the p-type semiconductor substrate 701. The insulator 701 is for isolation between transistors and is formed by means of a LOCOS (local oxidation of silicon) process. The gate oxide layer 703 is formed having a film thickness of 10 nm. The first to third polysilicon gate electrodes 704a, 704b, 704c are formed each having a film thickness of 300 nm. Phosphorous of high concentration is diffused into the first to third polysilicon gate electrodes 704a, 704b, 704c. Implantation of ions of phosphorous is performed using the first and third polysilicon gate electrodes 704a and 704c as a mask, to form the n-type diffusion layers 705a, 705b, 705c, 705d for an LDD structure. Subsequently, a p-type diffusion layer of low impurity concentration for an LDD structure is formed in a p-channel transistor region using a polysilicon gate electrode for a p-channel transistor as a mask, which is not shown in FIG. 17. Thereafter, an insulating layer used for sidewall formation is deposited having a film thickness of 100 nm. This insulating layer is etched anisotropically by a dry etching process (e.g., RIE), to form the sidewall insulating layer 706.

Figure 18:
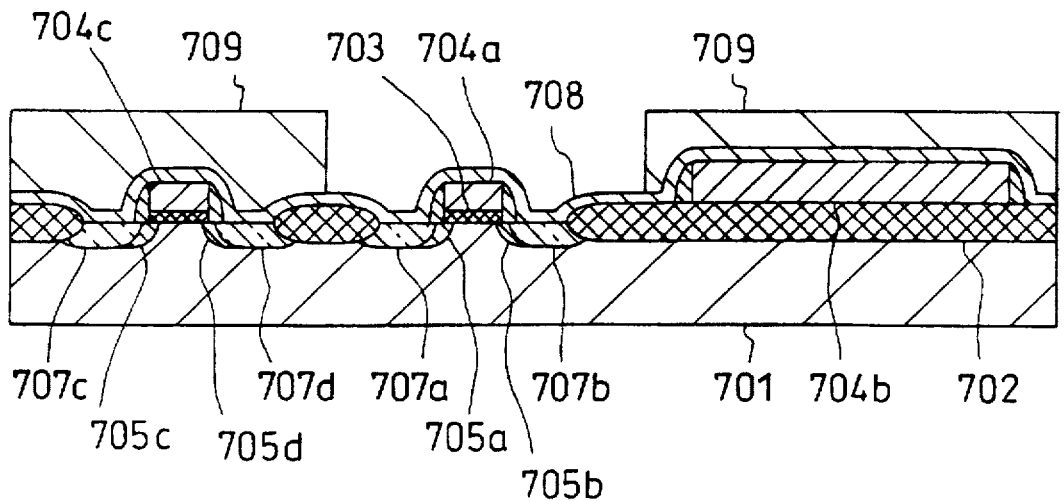

Next, as shown in FIG. 18, implantation of ions of arsenic is performed using the first and third polysilicon gate electrodes 704a, 704c and the sidewall insulating layer 706 as a mask. Then a heat treatment is carried out at a temperature of 900°C., to form the n-type diffusion layers 707a–707d. Implantation of ions of $BF_2$ is performed in a p-channel transistor region using a polysilicon gate electrode for a p-channel transistor as a mask, to form a p-type diffusion layer of high impurity concentration that becomes a source/drain region.

Next, a non-silicide-region forming oxide layer 708 is deposited having a film thickness of 100 nm. A resist pattern 709 is formed on the oxide layer 708. The oxide layer 708 is formed to cope with electrostatic destruction (ESD) defects. More specifically, the oxide layer 708 is a layer used to protect an outermost pad drive transistor on the p-type semiconductor substrate 701, made up of the third polysilicon gate electrode 704c, n-type diffusion layers 705c, 705d, n-type diffusion layers 707c, 707d, a protective element's gate electrode and diffusion layer, from silicidation defects. The resist pattern 709 is not formed on an internal circuit transistor, since it does not basically require a coating by the oxide layer 708. The resist pattern 709 is formed where the oxide layer 708 is required, that is to say, on the third polysilicon gate electrode 704c, and on the n-type diffusion layers 705c, 705d, and on the n-type diffusion layers 707c, 707d. The resist pattern 709 is formed on a part of the second polysilicon gate electrode 704b and on a part of the insulator 702.

Next, as shown in FIG. 19, the oxide layer 708 is etched using the resist pattern 709 as a mask, to form the first and second oxide layers 708a, 708b. Subsequently, a Ti thin film 711 is formed and an amorphous thin film 712 is formed. A resist pattern 713 is formed on the amorphous thin film 712. The amorphous thin film 712 is then etched using the formed resist pattern 713 as a mask.

Next, as shown in FIG. 20, a siliciding heat treatment is performed to react the Ti thin film 711 with the amorphous thin film 712, whereupon the first to third Ti silicide layers 714a, 714b, 714c are formed. An etching treatment with sulfuric is performed to get rid of unreacted Ti and TiN. As a result, the n-type diffusion layer 707b and the third Ti silicide layer 714c are electrically connected together. On the other hand, the third Ti silicide layer 714c and the second polysilicon gate electrode 704b are not electrically connected together because of the existence of the oxide layer 708b between them. Thereafter, an interlayer dielectric film, a contact hole, and an aluminum wiring layer, and a surface protective layer are formed one after another to complete a semiconductor device.

As shown in FIG. 20, the third Ti silicide layer 714c is electrically isolated by the existence of the oxide layer 708b from the second polysilicon gate electrode 704b. This forms a parallel-plate capacitor with electrodes (i.e., the third Ti silicide layer 714c and second polysilicon gate electrode 704b) and a dielectric (i.e., the oxide layer 708b). This parallel-plate capacitor has no bias-dependence, since neither the third Ti silicide layer 714c nor the second polysilicon gate electrode 704b has a depletion layer. Further, the oxide layer 708b has a film thickness of 100 nm which is 1/7 to 1/10 of that of an interlayer dielectric film for wiring, so that the present parallel-plate capacitor has a capacitance density seven to ten times that of a capacitor formed by a conventional interlayer dielectric film for wiring.

The formation of capacitors without bias dependence is a key to the mounting of high-precision analog circuits onto CMOS LSIs. In accordance with the seventh embodiment, a part of the oxide layer 708 is left on the second polysilicon Kate electrode 704b as the oxide layer 708b, to form the aforesaid parallel-plate capacitor. This enables the mounting of capacitors with a capacitance density seven to ten times that of a conventional one. Therefore, it is possible to provide a high-speed LSI with high-precision analog circuits.

In the seventh embodiment, the third Ti silicide layer 714c is used as a local wiring layer. Instead of the third Ti silicide layer 714c, a TiN layer may be employed. Further, in the seventh embodiment, the Ti thin film 711 is formed before the amorphous Si thin Film 712 is Formed in order that the third Ti silicide layer 714c serves as a local wiring layer. In the case of using a TiN layer as a local wiring layer, however, after the deposition of Ti thin film 711, a siliciding heat treatment is performed in order that the first to third Ti silicide layers 714a–714c are formed on only the first polysilicon gate electrode 704a, the n-type diffusion layers 707a, 707b, and a p-type diffusion layer of high impurity concentration (not shown in the figure). At this point in the process, a Ti thin film 711 not used to form a Ti silicide layer forms a Tin layer. Such a formed Tin layer is patterned by a photo-etching treatment to form a local wiring layer.

Further, in the seventh embodiment, the third Ti silicide layer 714c and the n-type diffusion layer 707b are electrically connected together; however, they may not be connected electrically or may be connected by means of aluminum metallization.

EXAMPLE 8

Figure 24:
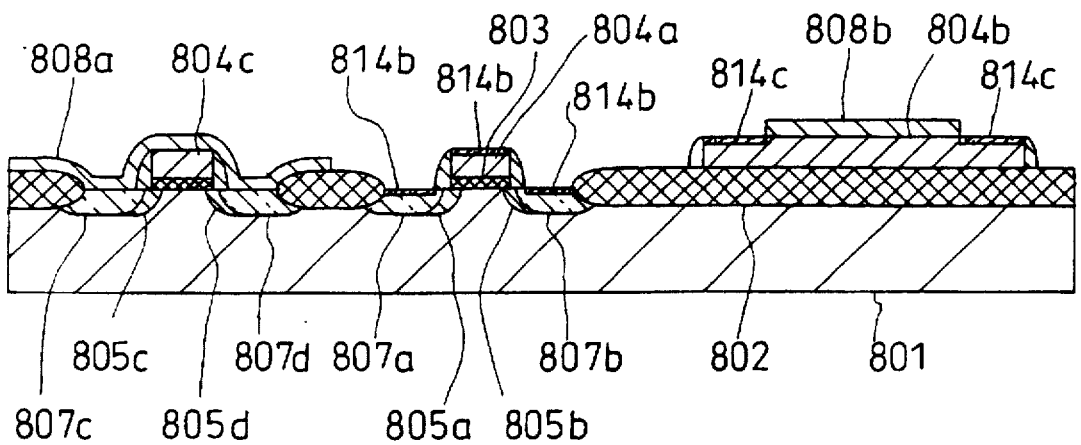
Figure 25:
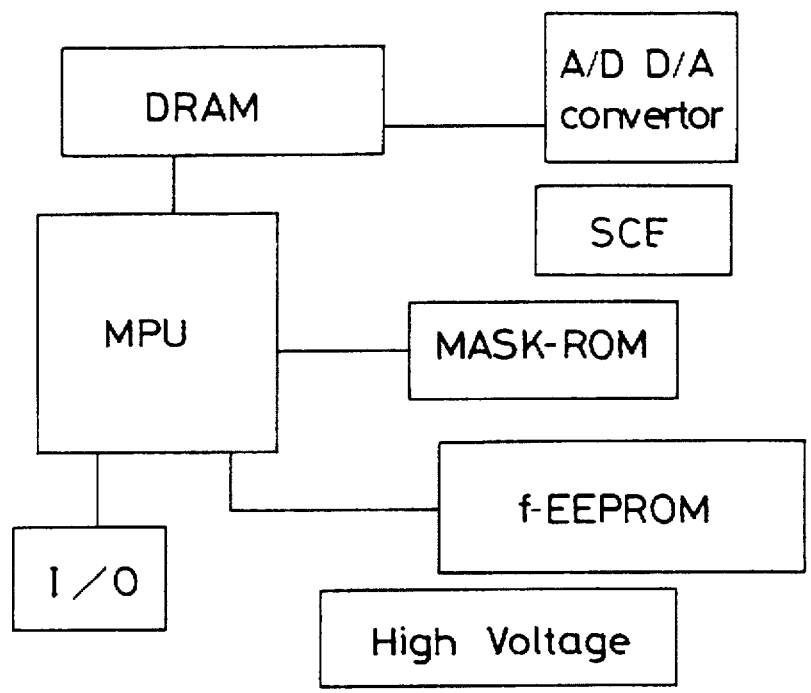
FIG. 25 is a diagram showing a prior art technique in which various circuits are mounted on their respective chips.
Figure 26:
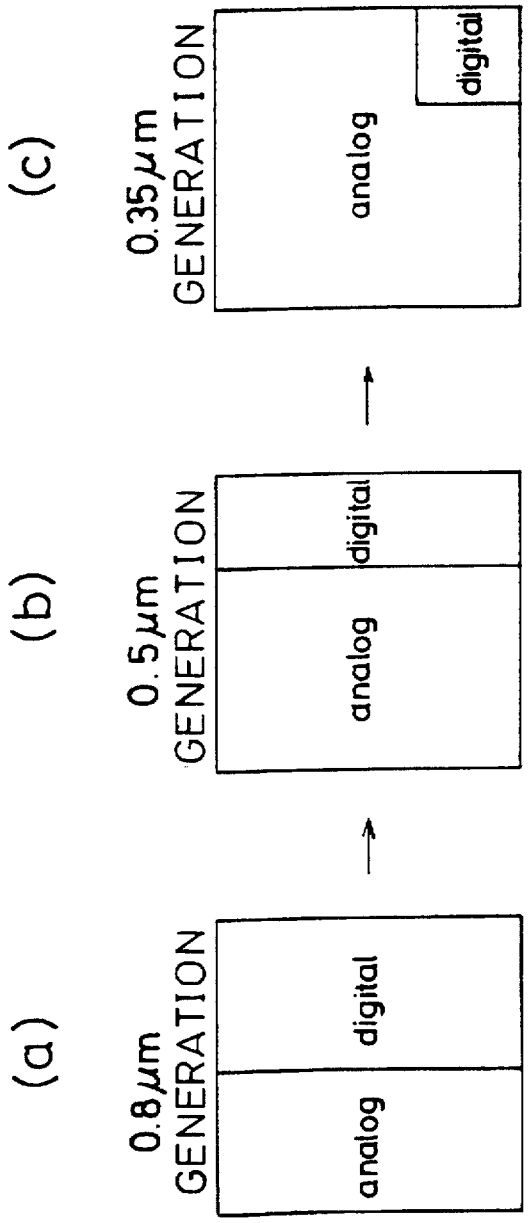
FIG. 26 shows how the analog circuit area-to-digital circuit area ratio has changed.

FIG. 24 shows in cross section an eighth semiconductor device of the present invention. For isolation between transistors, an insulator 802 of oxide having a film thickness of 500 nm is formed on a p-type semiconductor substrate 801. A thin-film transistor as a first transistor is formed on the p-type semiconductor substrate 801. An example of this thin-film transistor is shown in FIG. 24 in the form of an n-channel transistor. The n-channel transistor is made up of the following: a gate oxide layer 803; a first polysilicon gate electrode 804a; n-type diffusion layers 805a, 805b of low impurity concentration; and n-type diffusion layers 807a, 807b of high impurity concentration. The gate oxide layer 803 has a 10 nm film thickness and the first polysilicon gate electrode 804a has a 300 nm film thickness. The n-type diffusion layers 805a and 807a together form the source of the n-channel transistor. The n-type diffusion layers 805b and 807b together form the drain of the n-channel transistor. Generally, a p-channel transistor (not shown in the figure) is formed on the p-type semiconductor substrate 801.

A first Ti silicide layer 814a is formed on the first polysilicon gate electrode 804a. A sidewall insulating layer 806 is formed on the sidewalls of the first polysilicon gate electrode 804a. A second Ti silicide layer 814b is formed on the n-type diffusion layers 807a, 807b.

A first non-silicide-region forming oxide layer 808a as a silicidation prevention layer is formed on a third polysilicon gate electrode 804c, n-type diffusion layers 805c, 805d of low impurity concentration, and n-type diffusion layers 807c, 807d of high impurity concentration together forming an outermost pad drive transistor of the p-type semiconductor substrate 801 (i.e., a first transistor).

A second polysilicon gate electrode 804b forming a second transistor is formed on the insulator 802. A second non-silicide-region forming oxide layer 808b (i.e., an insulating zone that becomes a capacitor) is formed locally on the second polysilicon gate electrode 804b. A third Ti silicide layer 814c is formed on a part of the second polysilicon gate electrode 804b not covered with the oxide layer 808b. An area defined between each third Ti silicide layer 814c in the second polysilicon gate electrode 804b is not silicided, so that such a non-silicided area has a resistance corresponding to the resistance of polysilicon.

Referring now to the drawing figures, how the eighth semiconductor device is fabricated will be described below.

Figure 21:
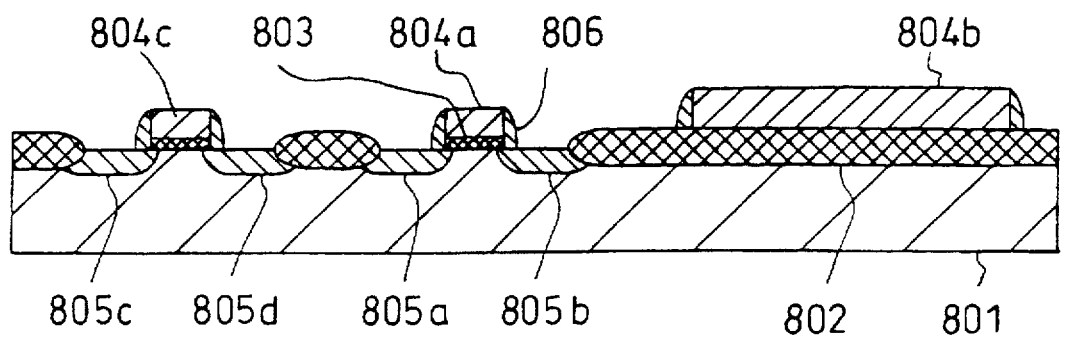
FIGS. 21–24 show in cross section steps of the fabrication of a semiconductor device in accordance with an eighth embodiment of the present invention.

As shown in FIG. 21, the insulator 802 is deposited on the p-type semiconductor substrate 801, having a film thickness of 500 nm. The insulator 801 is for isolation between transistors and is formed by means of a LOCOS (local oxidation of silicon) process. The gate oxide layer 803 is formed having a film thickness of 10 nm. The first to third polysilicon gate electrodes 804a, 804b, 804c are formed each having a film thickness of 300 nm. Phosphorous of high concentration is diffused into the first to third polysilicon gate electrodes 804a, 804b, 804c. Implantation of ions of phosphorous is performed using the first and third polysilicon gate electrodes 804a and 804c as a mask, to form the n-type diffusion layers 805a, 805b, 805c, 805d for an LDD structure. Subsequently, a p-type diffusion layer of low impurity concentration for an LDD structure is formed in a p-channel transistor region using a polysilicon gate electrode for a p-channel transistor as a mask, which is not shown in FIG. 21. Thereafter, an insulating layer used for sidewall formation is deposited having a film thickness of 100 nm. This insulating layer is etched anisotropically by a dry etching treatment (e.g., RIE), to form the sidewall insulating layer 806.

Figure 22:
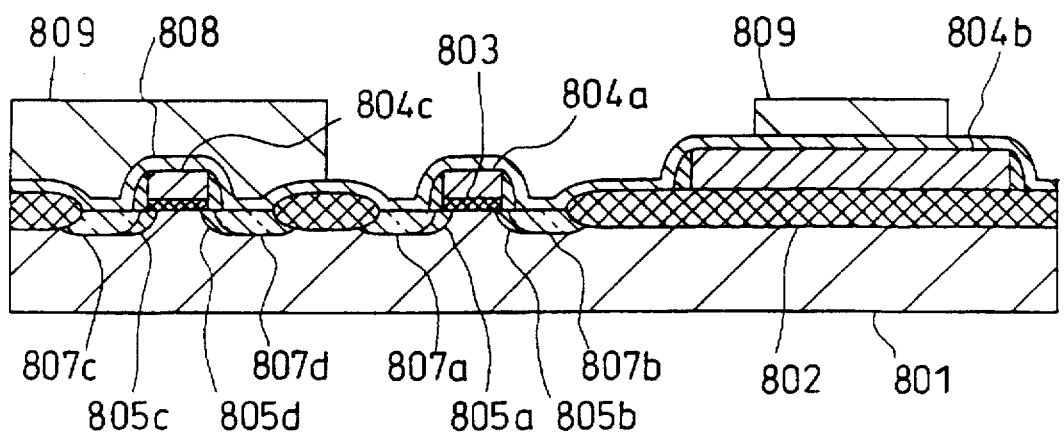

Next, as shown in FIG. 22, implantation of ions of arsenic is performed using the first and third polysilicon gate electrodes 804a, 804c and the sidewall insulating layer 806 as a mask. Then a heat treatment is carried out at a temperature of 900° C., to form the n-type diffusion layers 807a–807d. Implantation of ions of $BF_2$ is performed in a p-channel transistor region using a polysilicon gate electrode for a p-channel transistor as a mask, to form a p-type diffusion layer of high impurity concentration that becomes a source/drain region.

Next, a non-silicide-region forming oxide layer 808 is deposited having a film thickness of 100 nm. A resist pattern 809 is formed on the oxide layer 808. The oxide layer 808 is formed to cope with ESD. More specifically, the oxide layer 808 is a layer for protecting the third polysilicon gate electrode 804c, n-type diffusion layers 805c, 805d, n-type diffusion layers 807c, 807d, a protective element's gate electrode and diffusion layer together forming an outermost pad drive transistor of the p-type semiconductor substrate 801, from undergoing silicidation. The resist pattern 809 is not formed on an internal circuit transistor, since it does not require a coating of the oxide layer 808. The resist pattern 809 is formed where the oxide layer 808 is required, that is to say, on the third polysilicon gate electrode 804c, and on the n-type diffusion layers 805c, 805d, and on the n-type diffusion layers 807c, 807d. The resist pattern 809 is also formed on a part of the second polysilicon gate electrode 804b.

Figure 23:
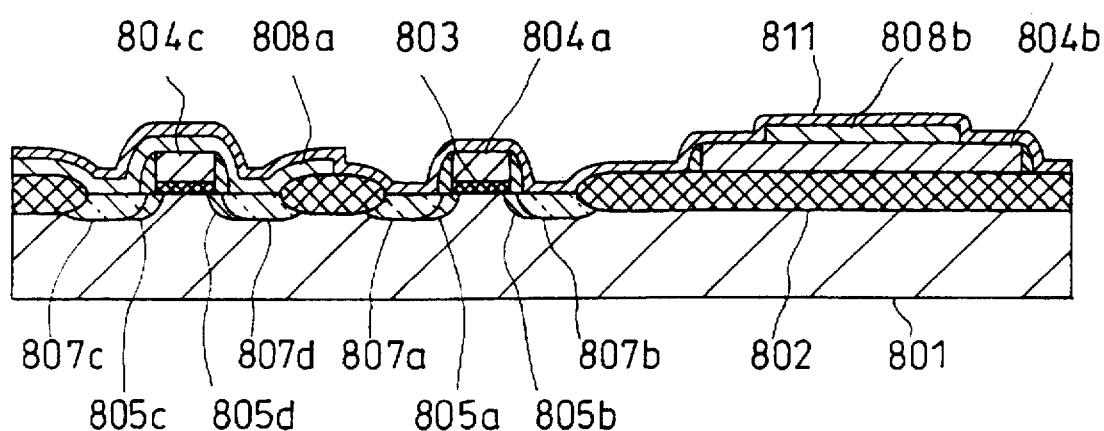

Next, as shown in FIG. 23, the oxide layer 808 is etched using the resist pattern 809 as a mask, to form the first and second oxide layers 808a, 808b. This is followed by the formation of a Ti thin film 811.

Next, as shown in FIG. 24, a siliciding heat treatment is performed to react the Ti thin film 811 with the first polysilicon gate electrode 804a, with the n-type diffusion layers 807a, 807b, and with the second polysilicon gate electrode 804b, whereupon the first Ti silicide layer 814a is formed on the first polysilicon gate electrode 804a, and the second Ti silicide layer 814b is formed on the n-type diffusion layers 807a, 807b, and the third Ti silicide layer 814c is formed on the second polysilicon gate electrode 804b. Subsequently, an etching treatment with sulfuric is performed to get rid of unreacted Ti and TiN. As a result of such arrangement, no silicide layers are formed on a part of the second polysilicon gate electrode 804b not covered by the oxide layer 808b. Thereafter, an interlayer dielectric film, a contact hole, and an aluminum wiring layer, and a surface protective layer are formed one after another to complete a semiconductor device.

As shown in FIG. 24, the third Ti silicide layer 814c is formed on a part of the second polysilicon gate electrode 804b not covered by the oxide layer 808b. An area between each third Ti silicide layer 814c is not silicided, so that such a non-silicided area has a resistance corresponding to the resistance of polysilicon. The second polysilicon gate electrode 804b has a sheet resistance of about 30 $\Omega/\square$, whereas a polysilicon gate electrode with a silicide layer formed between each third Ti silicide layer 814c has a sheet resistance of about 3 $\Omega/\square$. Therefore, in the case of forming resistance bodies having the same resistance, the present invention can provide a resistance body whose length is 1/10 of that of a conventional one.

The mounting of high-precision analog circuits on CMOS LSIs requires various resistance bodies with different resistance values. A part of the oxide layer 808 formed for the oxide layer 808a is left on the second polysilicon gate electrode 804b as the oxide layer 808b, to prevent silicidation from occurring to a resistance body formation area in the second polysilicon gate electrode 804b. This enables the mounting of capacitance bodies with a capacitance density seven to ten times that of a conventional one. In such a case, the second and third Ti silicide layers 814b, 814c are formed on a part of the n-type diffusion layer 807a, on a part of the n-type diffusion layer 807b, and on a part of the second polysilicon gate electrode 804b. As a result, resistance reduction can be performed where parasitic resistance reduction is required and it becomes possible to provide a high-speed LSI with high-precision analog circuits.

In the eighth embodiment, there are provided no wiring layers such as Ti silicide layers, but they may be formed. A case where a Ti silicide layer is used as a wiring layer is described. The Ti thin film 811 is deposited, before forming the amorphous Si thin film 812. Thereafter, a photo-etching treatment is performed to pattern the amorphous Si thin film 812, and a siliciding heat treatment is performed, and a sulfuric etching treatment is performed to remove unreacted Ti and TiN. Another case where a TiN layer is used as a wiring layer is described. The Ti thin film 811 is deposited, before performing a heat treatment for silicidation. Thereafter, a photo-etching treatment is carried out to patten a TiN layer for wiring. At this point of the process, a Ti thin film 811 that has not formed a Ti silicide layer forms TiN. This forms a wiring layer of TiN. The formed TiN layer is patterned by a photo-etching treatment to provide a local wiring layer. In the eighth embodiment, the third Ti silicide layer 814c and the n-type diffusion layer 807b are not electrically connected together; however, they may be connected together using the aforesaid wiring technique.

The invention claimed is:

1. A method of fabricating a semiconductor device comprising:

a first fabrication step of forming a transistor having a gate electrode on a semiconductor substrate while at the same time forming a capacitor lower electrode on said semiconductor substrate;

a second fabrication step of depositing an insulating layer on said gate electrode and on said lower electrode;

a third fabrication step of forming a resist pattern on said insulating layer in such a way as to mask said lower electrode;

a fourth fabrication step of anisotropically etching said insulating layer using said resist pattern as a mask to form a sidewall insulating layer on a sidewall of said gate electrode while at the same time forming a capacitance insulating layer of said capacitor on said lower electrode;

a fifth fabrication step of forming an upper electrode of said capacitor on said capacitance insulating layer.

2. The semiconductor device fabrication method of claim 1 wherein:

said fifth fabrication step comprising:
depositing a Ti thin film over said semiconductor substrate;
locally forming an amorphous Si thin film on said Ti thin film over said capacitance insulating layer;
performing a siliciding heat treatment to silicide said Ti thin film, to form said upper electrode of Ti silicide.

3. The semiconductor device fabrication method of claim 1 wherein:

said fifth fabrication step comprising:
depositing a Ti thin film over said semiconductor substrate;
performing a siliciding heat treatment with respect to said Ti thin film in an atmosphere of $N_2$, and nitriding a part of said Ti thin film not silicided, to form said upper electrode formed by a TiN thin film.

4. A method of fabricating a semiconductor device comprising:

a first fabrication step of forming a transistor on a periphery of a semiconductor substrate while at the same time forming a lower electrode of a capacitor on said semiconductor substrate;

a second fabrication step of depositing an insulating layer on said transistor and on said lower electrode;

a third fabrication step of forming a resist pattern on said insulating layer in such a way as to mask said transistor and said lower electrode;

a fourth fabrication step of etching said insulating layer using said resist pattern as a mask to form a silicidation prevention layer on said transistor while at the same time forming a capacitance insulating layer of said capacitor on said lower electrode;

a fifth fabrication step of forming an upper electrode of said capacitor on said capacitance insulating layer.

5. The semiconductor device fabrication method of claim 4 wherein:

said fifth fabrication step comprising:
depositing a Ti thin film over said semiconductor substrate;
locally forming an amorphous Si thin film on said insulating layer on said Ti thin film;
performing a siliciding heat treatment to silicide said Ti thin film, to form said upper electrode of Ti silicide.

6. The semiconductor device fabrication method of claim 4 wherein:

said fifth fabrication step comprising:
depositing a Ti thin film over said semiconductor substrate;
performing a siliciding heat treatment to silicide said Ti thin film in an atmosphere of $N_2$, and nitriding a part of said Ti thin film not silicided, to form said upper electrode of TiN.

* * * * *